US011430774B2

(12) United States Patent
Cok et al.

(10) Patent No.: US 11,430,774 B2
(45) Date of Patent: Aug. 30, 2022

(54) BEZEL-FREE DISPLAYS

(71) Applicant: X Display Company Technology Limited, Dublin (IE)

(72) Inventors: Ronald S. Cok, Rochester, NY (US); Brook Raymond, Cary, NC (US)

(73) Assignee: X Display Company Technology Limited, Dublin (IE)

( * ) Notice: Subject to any disclaimer, the term of this patent is extended or adjusted under 35 U.S.C. 154(b) by 140 days.

(21) Appl. No.: 17/130,617

(22) Filed: Dec. 22, 2020

(65) Prior Publication Data

US 2021/0111169 A1 Apr. 15, 2021

Related U.S. Application Data

(62) Division of application No. 15/966,540, filed on Apr. 30, 2018, now Pat. No. 10,910,355.

(51) Int. Cl.
*H01L 25/16* (2006.01)
*H01L 23/538* (2006.01)
(Continued)

(52) U.S. Cl.
CPC ........ *H01L 25/167* (2013.01); *H01L 21/6835* (2013.01); *H01L 23/5385* (2013.01);
(Continued)

(58) Field of Classification Search
CPC .............. H01L 25/167; H01L 25/0753; H01L 21/6835; H01L 21/4846; H01L 23/5385;
(Continued)

(56) References Cited

U.S. PATENT DOCUMENTS 3,709,589 A 1/1973 Lamb et al.
5,550,066 A 8/1996 Tang et al.
(Continued)

FOREIGN PATENT DOCUMENTS

WO WO-2010/132552 A1 11/2010
WO WO-2014/0149864 A1 9/2014
(Continued)

OTHER PUBLICATIONS

Bower, C. A. et al., Micro-Transfer-Printing: Heterogeneous Integration of Microscale Semiconductor Devises using Elastomer Stamps, IEEE Conference, (2014).
(Continued)

*Primary Examiner* — Thao X Le
*Assistant Examiner* — Gardner W. S. Swan
(74) *Attorney, Agent, or Firm* — Choate, Hall & Stewart LLP; Michael D. Schmitt

(57) ABSTRACT

A bezel-free display comprises a display substrate and an array of pixels. Pixel rows and pixel columns are separated by row and column distances and connected by row and column lines, respectively. A column driver is electrically connected to each of the column lines and a row driver is electrically connected to each of the row lines. Row-connection lines are electrically connected to each of the row lines or row drivers. In certain embodiments, each pixel in the column of pixels closest to a display substrate edge is spatially separated from the edge by a distance less than or equal to the column distance. At least one row driver is spatially separated from the corresponding row by a distance less than the column or row distance, at least one column driver is spatially separated from the corresponding column by a distance less than the column or row distance, or both.

18 Claims, 11 Drawing Sheets

(51) Int. Cl.
  *H01L 33/62* (2010.01)
  *H01L 21/683* (2006.01)
  *H01L 25/075* (2006.01)
  *H01L 33/00* (2010.01)
  *H01L 21/48* (2006.01)

(52) U.S. Cl.
  CPC ...... *H01L 23/5386* (2013.01); *H01L 25/0753* (2013.01); *H01L 33/0093* (2020.05); *H01L 33/62* (2013.01); *H01L 21/4846* (2013.01); *H01L 2221/68363* (2013.01)

(58) Field of Classification Search
  CPC . H01L 23/5386; H01L 33/0093; H01L 33/62; H01L 33/385; H01L 2221/68363; H01L 2221/68354; H01L 2221/68368
  USPC .......................................................... 257/88
  See application file for complete search history.

(56) References Cited

U.S. PATENT DOCUMENTS

| | | |
|---|---|---|
| 5,621,555 A | 4/1997 | Park |
| 6,084,579 A | 7/2000 | Hirano |
| 6,184,477 B1 | 2/2001 | Tanahashi |
| 6,403,985 B1 | 6/2002 | Fan et al. |
| 6,717,560 B2 | 4/2004 | Cok et al. |
| 6,756,576 B1 | 6/2004 | McElroy et al. |
| 6,825,559 B2 | 11/2004 | Mishra et al. |
| 7,417,648 B2 | 8/2008 | Credelle |
| 7,586,497 B2 | 9/2009 | Boroson et al. |
| 7,622,367 B1 | 11/2009 | Nuzzo et al. |
| 7,629,955 B2 | 12/2009 | Asao et al. |
| 7,687,812 B2 | 3/2010 | Louwsma et al. |
| 7,872,722 B2 | 1/2011 | Kimura |
| 7,932,123 B2 | 4/2011 | Rogers et al. |
| 7,943,491 B2 | 5/2011 | Nuzzo et al. |
| 7,982,296 B2 | 7/2011 | Nuzzo et al. |
| 7,999,454 B2 | 8/2011 | Winters et al. |
| 8,305,294 B2 | 11/2012 | Cok et al. |
| 8,333,860 B1 | 12/2012 | Bibl et al. |
| 8,506,867 B2 | 8/2013 | Menard |
| 8,558,243 B2 | 10/2013 | Bibl et al. |
| 8,619,011 B2 | 12/2013 | Kimura |
| 8,722,458 B2 | 5/2014 | Rogers et al. |
| 8,791,474 B1 | 7/2014 | Bibl et al. |
| 8,794,501 B2 | 8/2014 | Bibl et al. |
| 8,803,857 B2 | 8/2014 | Cok |
| 8,835,940 B2 | 9/2014 | Hu et al. |
| 8,865,489 B2 | 10/2014 | Rogers et al. |
| 8,884,844 B2 | 11/2014 | Yang et al. |
| 8,889,485 B2 | 11/2014 | Bower |
| 8,896,505 B2 | 11/2014 | Cok et al. |
| 8,934,259 B2 | 1/2015 | Bower et al. |
| 8,941,215 B2 | 1/2015 | Hu et al. |
| 8,987,765 B2 | 3/2015 | Bibl et al. |
| 9,105,714 B2 | 8/2015 | Hu et al. |
| 9,111,464 B2 | 8/2015 | Bibl et al. |
| 9,153,171 B2 | 10/2015 | Sakariya et al. |
| 9,161,448 B2 | 10/2015 | Menard et al. |
| 9,166,114 B2 | 10/2015 | Hu et al. |
| 9,217,541 B2 | 12/2015 | Bathurst et al. |
| 9,240,397 B2 | 1/2016 | Bibl et al. |
| 9,244,282 B2 | 1/2016 | Etienne et al. |
| 9,367,094 B2 | 6/2016 | Bibl et al. |
| 9,412,727 B2 | 8/2016 | Menard et al. |
| 9,437,782 B2 | 9/2016 | Bower et al. |
| 9,444,015 B2 | 9/2016 | Bower et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,589,944 B2 | 3/2017 | Higginson et al. |
| 9,626,908 B2 | 4/2017 | Sakariya et al. |
| 9,698,308 B2 | 7/2017 | Bower et al. |
| 9,705,042 B2 | 7/2017 | Bower et al. |
| 9,765,934 B2 | 9/2017 | Rogers et al. |
| 9,860,955 B2 | 1/2018 | Kim et al. |
| 9,865,832 B2 | 1/2018 | Bibl et al. |
| 10,475,876 B2 | 11/2019 | Bower et al. |
| 2002/0075440 A1 | 6/2002 | Deane |
| 2002/0096994 A1 | 7/2002 | Iwafuchi et al. |
| 2002/0175882 A1 | 11/2002 | Edwards et al. |
| 2005/0264472 A1 | 12/2005 | Rast |
| 2006/0063309 A1 | 3/2006 | Sugiyama et al. |
| 2006/0214287 A1 | 9/2006 | Ogihara et al. |
| 2007/0035340 A1 | 2/2007 | Kimura |
| 2007/0040770 A1 | 2/2007 | Kim |
| 2008/0012794 A1 | 1/2008 | Battersby |
| 2008/0018583 A1 | 1/2008 | Knapp et al. |
| 2008/0266214 A1 | 10/2008 | Naugler et al. |
| 2008/0303756 A1 | 12/2008 | Smith |
| 2009/0250690 A1 | 10/2009 | Shin et al. |
| 2010/0002180 A1 | 1/2010 | Kim et al. |
| 2010/0066967 A1 | 3/2010 | Takahashi et al. |
| 2010/0123694 A1 | 5/2010 | Cok et al. |
| 2010/0186883 A1 | 7/2010 | Tomoda |
| 2010/0214247 A1 | 8/2010 | Tang et al. |
| 2011/0032277 A1 | 2/2011 | Lee et al. |
| 2011/0073864 A1 | 3/2011 | Liu et al. |
| 2011/0242027 A1 | 10/2011 | Chang |
| 2012/0062135 A1 | 3/2012 | Tamaki et al. |
| 2012/0126233 A1 | 5/2012 | Chang et al. |
| 2012/0206428 A1 | 8/2012 | Cok |
| 2012/0206499 A1 | 8/2012 | Cok |
| 2012/0223875 A1 | 9/2012 | Lau et al. |
| 2013/0088416 A1 | 4/2013 | Smith et al. |
| 2013/0229400 A1 | 9/2013 | Kim et al. |
| 2013/0273695 A1 | 10/2013 | Menard et al. |
| 2014/0082934 A1 | 3/2014 | Cok |
| 2014/0085214 A1 | 3/2014 | Cok |
| 2014/0111442 A1 | 4/2014 | Cok et al. |
| 2014/0131715 A1 | 5/2014 | Liu et al. |
| 2014/0159043 A1 | 6/2014 | Sakariya et al. |
| 2014/0240617 A1 | 8/2014 | Fukutome et al. |
| 2014/0267683 A1 | 9/2014 | Bibi et al. |
| 2014/0319486 A1 | 10/2014 | Hong |
| 2015/0135525 A1 | 5/2015 | Bower |
| 2015/0296580 A1 | 10/2015 | Kim et al. |
| 2015/0359065 A1 | 12/2015 | Park et al. |
| 2015/0362165 A1 | 12/2015 | Chu et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372393 A1 | 12/2015 | Bower et al. |
| 2016/0005721 A1 | 1/2016 | Bower et al. |
| 2016/0018094 A1 | 1/2016 | Bower et al. |
| 2016/0057822 A1 | 2/2016 | Chu |
| 2016/0057832 A1 | 2/2016 | Briggs et al. |
| 2016/0093600 A1 | 3/2016 | Bower et al. |
| 2016/0266697 A1 | 9/2016 | Cheng et al. |
| 2016/0290600 A1 | 10/2016 | Biederman et al. |
| 2016/0300900 A1 | 10/2016 | Miyake |
| 2016/0343771 A1 | 11/2016 | Bower et al. |
| 2016/0343772 A1 | 11/2016 | Bower et al. |
| 2017/0025075 A1 | 1/2017 | Cok et al. |
| 2017/0032735 A1 | 2/2017 | Lee et al. |
| 2017/0048976 A1 | 2/2017 | Prevatte et al. |
| 2017/0068362 A1 | 3/2017 | Den Boer et al. |
| 2017/0102797 A1 | 4/2017 | Cok |
| 2017/0167703 A1 | 6/2017 | Cok |
| 2017/0177105 A1 | 6/2017 | Wu et al. |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0250167 A1 | 8/2017 | Bower et al. |
| 2017/0256521 A1 | 9/2017 | Cok et al. |
| 2017/0256522 A1 | 9/2017 | Cok et al. |
| 2017/0287992 A1 | 10/2017 | Kwak et al. |
| 2017/0338374 A1 | 11/2017 | Zou et al. |
| 2017/0357127 A1 | 12/2017 | Cok et al. |

(56) References Cited

U.S. PATENT DOCUMENTS

| | | |
|---|---|---|
| 2018/0033853 A1 | 2/2018 | Bower et al. |
| 2018/0122298 A1 | 5/2018 | Lee et al. |
| 2018/0301472 A1 | 10/2018 | Matsukizono |
| 2019/0157512 A1 | 5/2019 | Jung et al. |
| 2019/0265478 A1 | 8/2019 | Cok et al. |
| 2019/0267363 A1 | 8/2019 | Bower et al. |
| 2020/0051482 A1 | 2/2020 | Cok et al. |
| 2020/0052063 A1 | 2/2020 | Bower et al. |

FOREIGN PATENT DOCUMENTS

| | | |
|---|---|---|
| WO | WO-2015/193434 A2 | 12/2015 |
| WO | WO-2016/030422 A1 | 3/2016 |
| WO | WO-2017/060487 A2 | 4/2017 |
| WO | WO-2017/149067 A1 | 9/2017 |

OTHER PUBLICATIONS

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Cok, R. S. et al., AMOLED displays with transfer-printed integrated circuits, Journal of SID, 19(4):335-341, (2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Hamer, J. W. et al. 63.2: AMOLED Displays Using Transfer-Printed Integrated Circuits, SID 09 Digest, 40(2):947-950 (2009).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

Yoon, J. et al., Heterogeneously Integrated Optoelectronic Devices Enabled by MicroTransfer Printing, Adv. Optical Mater., 3:1313-1335 (2015).

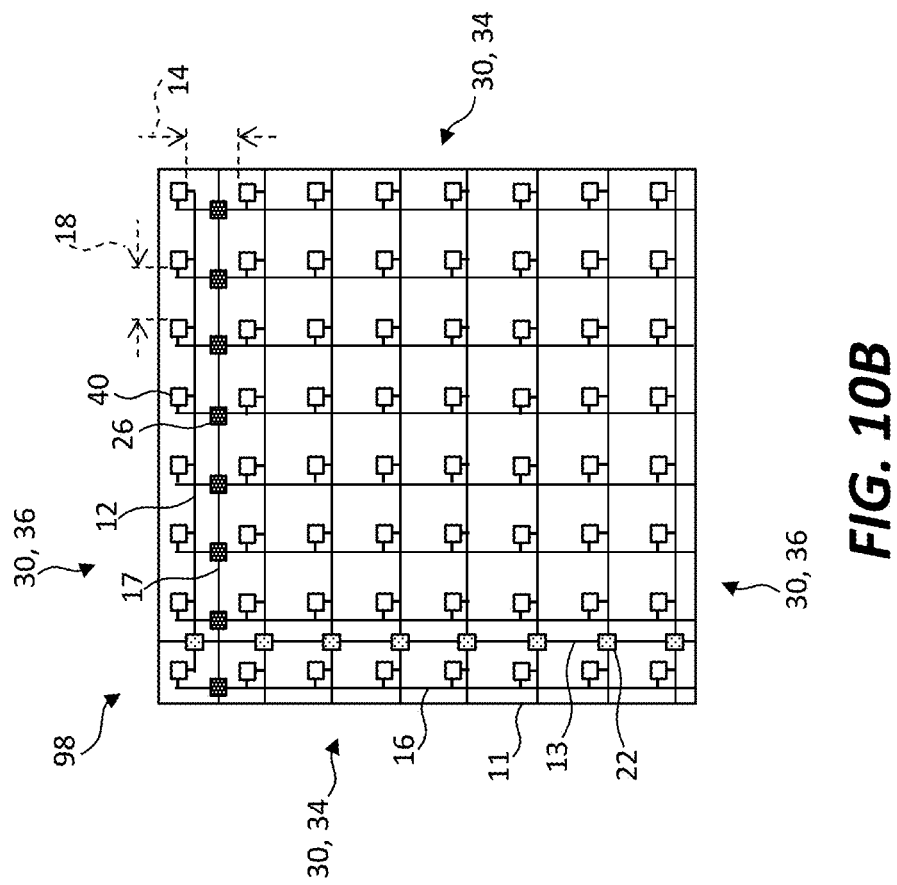

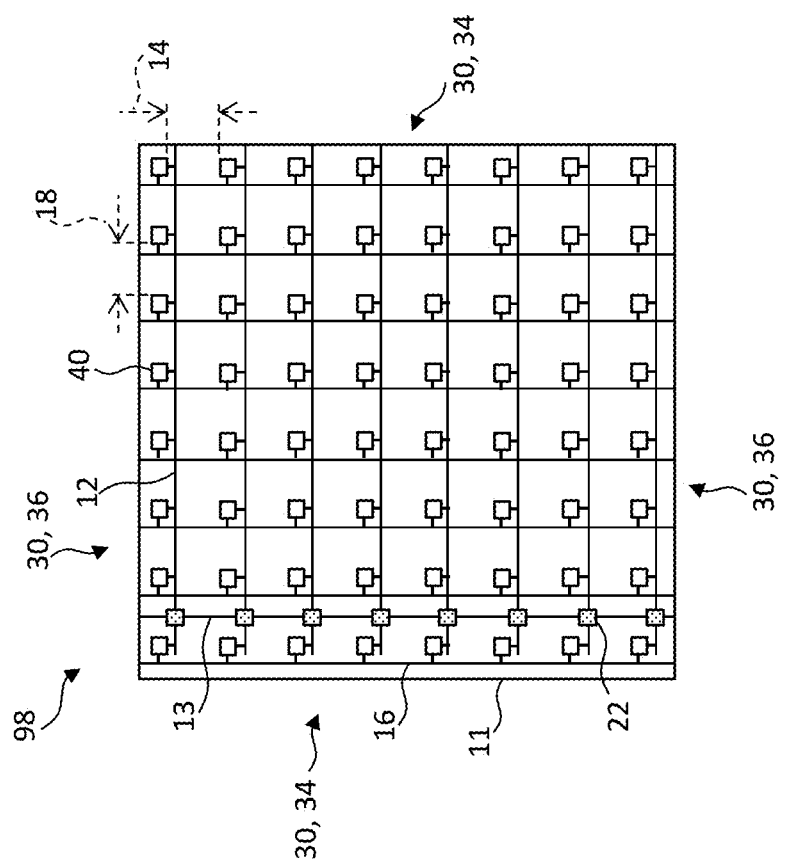

BEZEL-FREE DISPLAYS

PRIORITY APPLICATION

This application is a division of U.S. patent application Ser. No. 15/966,540, filed on Apr. 30, 2018, the disclosure of which is hereby incorporated by reference in its entirety.

FIELD OF THE INVENTION

The present invention relates generally to inorganic light-emitting diode flat-panel displays.

BACKGROUND OF THE INVENTION

Flat-panel displays are widely used in conjunction with computing devices, in portable devices, and for entertainment devices such as televisions. Such displays typically employ an array of pixels distributed in rows and columns over a display substrate in a display area to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode (OLED) displays rely on passing current through a layer of organic material that glows in response to the current. Displays using inorganic light emitting diodes (LEDs) are also in widespread use for outdoor signage and have been demonstrated in a 55-inch television.

Pixels in a display are typically arranged in an array of rows and columns in a display area on a display substrate and controlled through a matrix-addressing scheme in which rows of pixels are connected to a common row-select line and columns of pixels are connected to a common column-data line. By enabling a row of pixels and concurrently providing data on all of the column-data lines, each pixel in the row receives data from a corresponding column at the same time. Each row of pixels is sequentially enabled to provide data to all of the display pixels. The row-select lines are typically controlled by a row controller and the column-data lines by a column controller.

In flat-panel display designs, the column-data lines extend past the bottom of the display area on the display substrate in a dense array where they are electrically connected to a display controller through an electrical bus such as a flex cable. The row-select lines extend into the bezel on either side of the display area and are then routed to the flex cable at the bottom of the display substrate. Generally, a bezel is the edge area of a display substrate that surrounds the display area in which the display pixels are disposed, for example the space or frame surrounding the display area. The bezel is often used for a frame to support the display substrate and to route power, ground, and control wires for the pixels in the display area of the display substrate. It is often desirable to minimize the bezel to reduce materials costs and the display size and for an improved appearance. It is also helpful for display tiles in a tiled display to have a small bezel to enable line-free tiling.

A variety of techniques are known to reduce the bezel size for displays. For example, U.S. Patent Publication No. 2015/0359065 discloses wrapping wires around an edge of the display substrate to connect them to electronic circuits on the back of the display substrate. This design requires non-standard processing methods that can be complex and difficult. U.S. Patent Publication Nos. 2002/0075440, 2008/0018583, and 2008/0012794 all disclose LCDs with row-select wires routed to the same side of the display as the column-data wires. However, since the light-controlling pixels are most effective with a large fill-factor and the wire routing and control take considerable space on the display substrate, the light controllers (e.g., liquid crystals) are provided in a separate layer disposed over the wiring and control circuit layer, increasing thickness and requiring additional structures.

Other techniques rely on obscuring the display bezel, for example U.S. Pat. No. 9,244,282 describes an optical structure with an array of prisms and U.S. Pat. No. 8,305,294 discloses display tiles with overlapping bezels. These designs increase the thickness of their respective displays.

Many large-format displays use inorganic light-emitting diodes (iLEDs) in the display pixels. However, such iLEDs are typically large (for example greater than one millimeter in diameter) and limit the display resolution. Micro-iLEDs are known that have an area less than 1 mm square, less than 100 microns square, or less than 50 microns square or have an area small enough that it is not visible to an unaided observer of the display at a designed viewing distance. U.S. Pat. No. 8,722,458 entitled Optical Systems Fabricated by Printing-Based Assembly teaches transferring light-emitting, light-sensing, or light-collecting semiconductor elements from a wafer substrate to a destination substrate such as a display substrate. However, micro-iLED displays do not, intrinsically, address issues regarding display bezels.

There is a need, therefore, for image display architectures that enable improved resolution with lower cost, and a reduced bezel size or no bezel in matrix-addressed systems.

SUMMARY OF THE INVENTION

According to certain embodiments of the present invention, a bezel-free display comprises a display substrate comprising a connection edge and one or more bezel edges, pixels individually disposed on the display substrate in rows and columns such that columns of the pixels are separated by a column distance, rows of the pixels are separated by a row distance. Each of the pixels comprises one or more inorganic micro-light-emitting diodes, each of the one or more inorganic micro-light-emitting diodes comprising a diode substrate independent, separate, and distinct from the display substrate. Column lines are disposed on the display substrate and extend toward the connection edge. Each of the column lines is electrically connected to each of the pixels in one of the columns of the pixels. A column driver is electrically connected to each of the column lines and each column driver is disposed on the display substrate. Row lines are disposed on the display substrate and each of the row lines is electrically connected to each of the pixels in one of the rows of the pixels. A row driver is electrically connected to each of the row lines and each row driver is disposed on the display substrate. One or more row-connection lines are disposed on the display substrate and each of the one or more row-connection lines is electrically connected to one of the row lines or one of the row drivers. At least one of the one or more row-connection lines is disposed at least partially between columns of the pixels. In certain embodiments, at least one row driver is spatially separated from the corresponding row by a distance less than at least one of the column distance and the row distance, at least one column driver is spatially separated from the corresponding column by a distance less than at least one of the row distance and the column distance, or both.

In some embodiments of the present invention, each pixel in one of the rows of the pixels closest to one of the one or more bezel edges is separated from the bezel edge by a distance less than or equal to the row distance. In certain embodiments, each pixel in one of the columns of the pixels closest to one of the one or more bezel edges is spatially separated from the bezel edge by a distance less than or equal to the column distance.

In some embodiments of the present invention, any combination of inorganic micro-light-emitting diodes, row drivers, or column drivers has at least one of (i) a width from 2 to no more than 5 µm, 5 to no more than 10 µm, 10 to no more than 20 µm, 20 to no more than 50 µm, or 50 to no more than 100 µm, (ii) a length from 2 to no more than 5 µm, 5 to no more than 10 µm, 10 to no more than 20 µm, 20 to no more than 50 µm, 50 to no more than 100 µm, 100 to no more than 250 µm, and (iii) a thickness from 2 to no more than 5 µm, 5 to no more than 10 µm, 10 to no more than 20 µm, or 20 to no more than 50 µm.

In some embodiments of the present invention, (i) each inorganic micro-light-emitting diode is a micro-transfer printed micro-light-emitting diode comprising a broken or separated tether, (ii) each row driver is a micro-transfer-printed micro-integrated circuit comprising a broken or separated tether, (iii) each column driver is a micro-transfer-printed micro-integrated circuit comprising a broken or separated tether, or (iv) any combination of (i), (ii), and (iii).

In some embodiments of the present invention, two or more or of the one or more row-connection lines are disposed at least partially between columns of the pixels. In some embodiments of the present invention, one of the one or more row-connection lines is disposed at least partially between one of the columns of the pixels and one of the one or more bezel edges.

In some embodiments of the present invention, a bezel-free display is a substantially single-layer display in which wires (e.g., row lines, column lines, power lines, and ground lines) and pixels are disposed substantially in a single layer on a display substrate.

In some embodiments of the present invention, a bezel-free display comprises a plurality of row drivers. Each row driver comprises a row-driver substrate separate, distinct, and independent of the display substrate and the row-driver substrate of any other row driver, and each row driver is electrically connected to one or more of the row lines. In certain embodiments, each of two or more of the plurality of row drivers is disposed between two or more of the pixels in one or two dimensions. One or more of the plurality of row drivers can be electrically connected to two row lines.

In some embodiments of the present invention, a bezel-free display comprises a plurality of column drivers. Each column driver comprises a column-driver substrate separate, distinct, and independent of the display substrate and the column-driver substrate of any other column driver, and each column driver is electrically connected to one or more of the column lines. In certain embodiments, each of two or more of a plurality of column drivers is disposed between two or more of the pixels in one or two dimensions. One or more of the plurality of column drivers can be electrically connected to two column lines.

In some embodiments of the present invention, one or more of the pixels each comprise a pixel substrate with the one or more inorganic light emitters of the pixel disposed on the pixel substrate. The pixel substrate can be micro-transfer printed onto the display substrate and the pixel substrate can comprise a broken or separated tether. The pixel substrate can have at least one of (i) an area of 10 to no more than 50 square microns, 50 to no more than 100 square microns, 100 to no more than 500 square microns, or 500 square microns to no more than 1 square mm and (ii) a thickness of 1 to no more than 5 microns, 5 to no more than 10 microns, 10 to no more than 20 microns, or 20 to no more than 50 microns.

In some embodiments of the present invention, a bezel-free display tile comprises a tile substrate comprising at least four bezel edges, two bezel edges of the at least four bezel edges are opposing row edges and two bezel edges of the at least four bezel edges are opposing column edges. Pixels are individually disposed on the tile substrate in rows and columns such that columns of the pixels are separated by a column distance, rows of the pixels are separated by a row distance, and each of the pixels comprises one or more inorganic micro-light-emitting diodes. Each of the one or more inorganic micro-light-emitting diodes comprises a diode substrate independent, separate, and distinct from the tile substrate. Column lines are disposed on the tile substrate and extend toward at least one of the two row edges. Each column line is electrically connected to each of the pixels in one of the columns of the pixels. Row lines dare disposed on the tile substrate and extend toward at least one of the two column edges. Each row line is electrically connected to each of the pixels in one of the rows of the pixels.

In some embodiments of the present invention, at least one of:
- a row driver is electrically connected to at least one of the row lines, the row driver disposed on the tile substrate within at least one of a column distance and a row distance of the at least one of the row lines, and
- (ii) a column driver is electrically connected to at least one of the column lines, the column driver disposed on the tile substrate within at least one of a row distance and a column distance of the at least one of the column lines.

In some embodiments, at least one of:
- (i) each pixel in one of the columns of the pixels closest to a column edge of the two opposing column edges is spatially separated from the column edge by a distance less than or equal to the column distance, and
- (ii) each pixel in one of the rows of the pixels closest to a row edge of the two opposing row edges is spatially separated from the row edge by a distance less than or equal to the row distance.

In some embodiments of the present invention, a row driver is disposed within at least one of a column distance and a row distance of a corresponding row line to which the row driver is electrically connected, and a column driver is disposed within at least one of a row distance and a column distance of a corresponding column line to which the column driver is electrically connected.

In some embodiments, (i) the one or more inorganic micro-light-emitting diodes are micro-transfer printed inorganic micro-light-emitting diodes each comprising a broken or separated tether, (ii) the row driver is a micro-transfer printed integrated circuit comprising a broken or separated tether, (iii) the column driver is a micro-transfer printed integrated circuit comprising a broken or separated tether, or (iv) any combination of (i), (ii), and (iii).

In some embodiments of the present invention, one or more of the pixels each comprise a pixel substrate with the one or more inorganic light emitters disposed on the pixel substrate. The pixel substrate can be micro-transfer printed onto the tile substrate, and the pixel substrate can comprise a broken or separated tether.

In some embodiments, the bezel-free display, bezel-free display tile, or bezel-free tiled display is a matrix-addressed display comprising inorganic micro-light-emitting-diodes (micro-iLEDs) and has row-select and column-data wires (row lines and column lines), as well as power and ground lines. Each micro-iLED is controlled by a row line in combination with a column line. The control can be passive-matrix control. In other embodiments, the bezel-free display is an active-matrix display and a micro-controller, for example a pixel controller, is disposed in, on, or over the display substrate in a display area in association with one or more micro-iLEDs in a pixel and is electrically connected to the one or more micro-iLEDs to control the one or more micro-iLEDs using select and data signals provided by the row lines and column lines, respectively.

In certain embodiments, micro-iLEDs are organized into pixels and a plurality of pixels forms a regular array on the display substrate in a display area or the pixels are irregularly or randomly arranged. Each pixel can comprise one or more micro-iLEDs. In certain embodiments, each pixel includes a single light emitter. In certain embodiments, each pixel includes at least three light emitters, each of the at least three light emitters emitting light of a different color, for example red, green, or blue.

In some embodiments, the one or more micro-iLEDs are disposed on a display substrate. In other embodiments, the one or more micro-iLEDs in a pixel are disposed on a pixel substrate separate and independent from the display substrate and each pixel substrate is disposed on or over the display substrate or a layer on the display substrate. A single micro-iLED, or multiple micro-iLEDs can be disposed on each pixel substrate. In other embodiments, multiple pixels share a common pixel substrate. In certain embodiments, each pixel includes a pixel controller and the pixel controller is electrically connected to the one or more micro-iLEDs in the pixel to emit light. In some embodiments, the pixel controller is located on the display substrate. In other embodiments, a pixel includes a pixel substrate separate from the display substrate and the pixel controller is located on the pixel substrate. Each pixel substrate can comprise a broken or separated tether as a consequence of micro-transfer printing the pixel substrate. In other configurations, each micro-iLED of the plurality of micro-iLEDs has a broken or separated tether as a consequence of micro-transfer printing the micro-iLEDs. Pixel controllers can be micro-transfer printed and have a broken or separated tether as a consequence of micro-transfer printing the pixel controller.

In certain embodiments, one or more electrical conductors such as row or column lines electrically connect two or more of the pixels in the display area. In certain embodiments, the one or more row or column lines conduct control signals for controlling the pixels. Power lines can conduct power to the pixels and ground lines can provide a ground reference voltage.

In certain embodiments, the display substrate or pixel substrate is at least one of plastic, glass, and sapphire. In certain embodiments, the display substrate or pixel substrate is transparent to visible light. In certain embodiments, the display substrate or pixel substrate is at least partially transparent to visible light. In certain embodiments, the display substrate or pixel substrate has no less than 30 percent transparency to visible light (e.g., no less than 30%, 50%, 70%, 80%, 90%, or 95% transparency to visible light). In certain embodiments, the pixel substrate is a semiconductor substrate, for example a silicon semiconductor.

Certain embodiments of the present invention provide bezel-free displays, bezel-free display tiles, or bezel-free tiled displays having a reduced bezel area or no bezel area, thereby reducing the size and improving the appearance of the bezel-free displays, bezel-free display tiles, or bezel-free tiled displays. In certain embodiments, a bezel-free display or bezel-free display tile is or is used in a transparent display.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 10B is a plan view of a bezel-free tile in the tiled display of FIG. 10A comprising both row and column drivers according to illustrative embodiments of the present invention;

FIG. 10C is a plan view of a bezel-free tile in the tiled display of FIG. 10A comprising row drivers according to illustrative embodiments of the present invention.

Figure 1A:
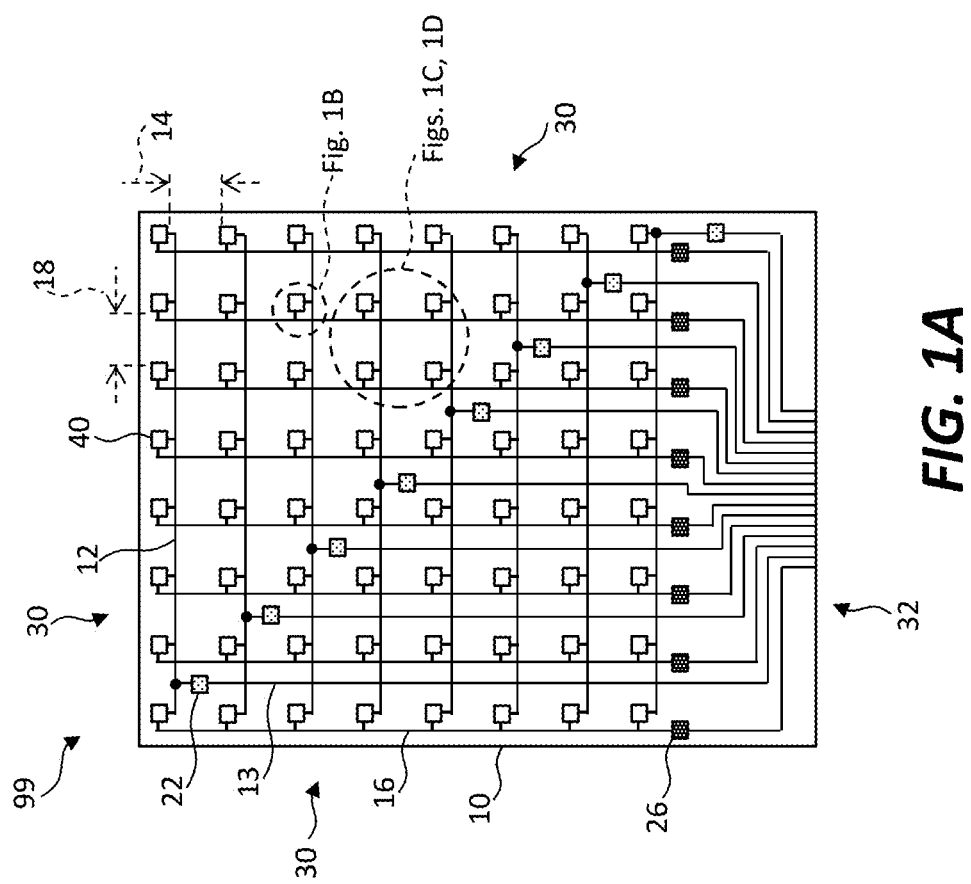
FIG. 1A is a schematic plan view illustrating an exemplary bezel-free display according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Certain embodiments of the present invention provide a bezel-free or reduced-size bezel for an inorganic micro-light-emitting diode (micro-iLED) display. Because the micro-iLEDs each have a small spatial extent within a larger display area of the bezel-free display, power, ground, row-select, and column-data wires providing a matrix-addressed control structure to the micro-iLED pixels in the display can be located between the micro-iLEDs within the display area in, on, or over a display substrate, rather than on the edges of the display substrate outside the display area.

Figure 1D:
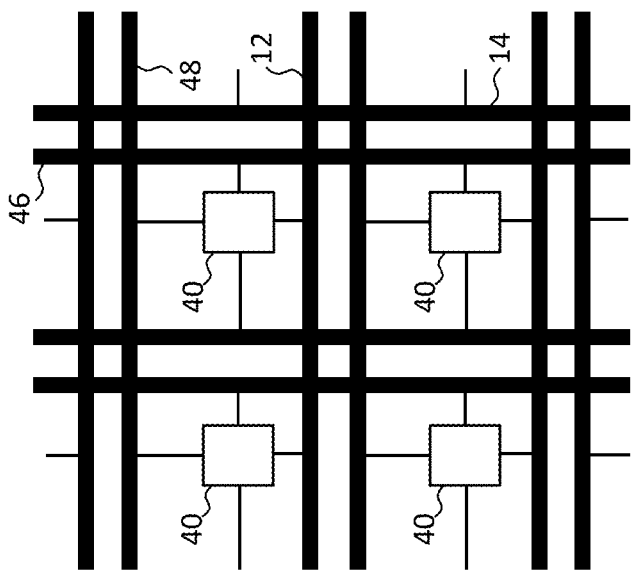
FIG. 1D is a detail schematic of the exemplary bezel-free display illustrated in FIG. 1A and according to illustrative embodiments of the present invention.
Figure 1B:
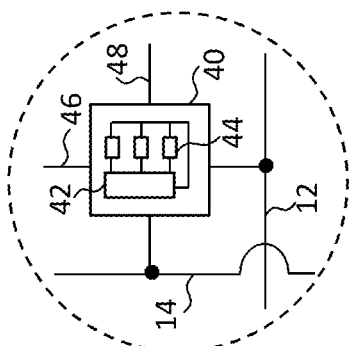
FIG. 1B is a detail schematic of the exemplary bezel-free display illustrated in FIG. 1A and according to illustrative embodiments of the present invention.
Figure 1C:
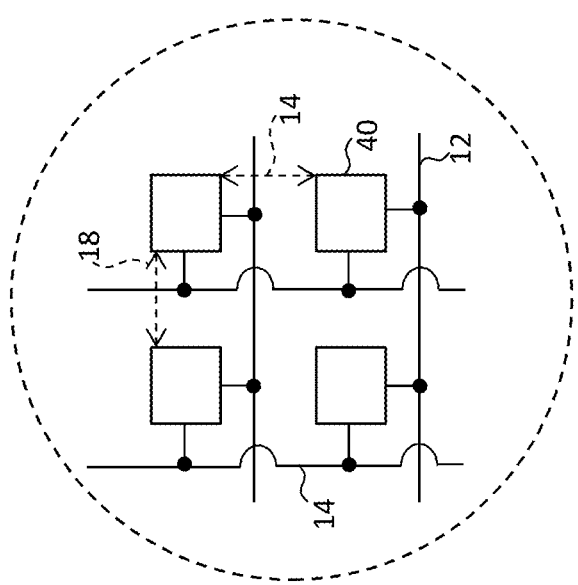
FIG. 1C is a detail schematic of the exemplary bezel-free display illustrated in FIG. 1A and according to illustrative embodiments of the present invention.

Referring to the plan view of FIG. 1A and the detail illustrations of FIGS. 1B, 1C, and 1D, according to some embodiments of the present invention a bezel-free display 99 comprises a display substrate 10 comprising a connection edge 32 and one or more bezel edges 30. A display substrate 10 provides a substantially planar surface, for example a rectangular surface as shown in FIG. 1A with four edges, one of which, according to some embodiments of the present invention, is a connection edge 32 and the others, for example three other edges, are bezel edges 30. A connection edge 32 provides electrical connections to a bezel-free display 99. In some embodiments, a display substrate 10 is polygonal but not rectangular or has curved edges (e.g., is circular).

Pixels 40 are individually disposed on a display substrate 10 in rows and columns such that columns of pixels 40 are separated by a column distance 18 and rows of pixels 40 are separated by a row distance 14. Columns of pixels 40 and rows of pixels 40 can be, but are not necessarily, each parallel to one or more edges of a display substrate 10. Moreover, columns of pixels 40 and rows of pixels 40 can be, but are not necessarily, perpendicular to each other. As an illustrative example, a display substrate 10 can have the shape of a parallelogram with columns of pixels 40 parallel to two edges of the display substrate 10 and rows of pixels 40 parallel to two edges of the display substrate 10. Thus, in certain embodiments, pixels 40 are arranged in a two-dimensional matrix having a pixel pitch or pixel separation in a horizontal direction equal to the column distance 18 and a pixel pitch or pixel separation in the vertical direction equal to the row distance 14. The row distance 14 can be a pixel pitch in the direction of the rows or the row distance 14 can be a distance between the pixels 40 in the rows (as shown in FIGS. 1A and 1C). Likewise, a column distance 18 can be a pixel pitch in the direction of the columns or the distance between the pixels 40 in the columns. A pixel pitch is the distance from a point (e.g., the center) of one pixel 40 to an equivalent point (e.g., the center) of an adjacent pixel 40 and the distance between the pixels 40 is the distance between edges of adjacent pixels 40. The difference between the pixel pitch and the pixel distance is the size or extent of the pixels 40 in the respective directions. The row distance 14 can be, but is not necessarily, the same distance as the column distance 18. A column distance 18 can be a maximum distance by which any two columns of pixels 40 are disposed. Likewise, a row distance 14 can be a maximum distance by which any two columns of pixels are disposed.

An array of micro-iLEDs 44 or pixels 40 can define a display area on a display substrate surface, for example a convex hull area that includes all of the micro-iLEDs 44 or pixels 40, for example a rectangular display area. (The words, "columns" and "rows", as well as "vertical" and "horizontal", "top" and "bottom", or "left" and "right" are relative terms and can be interchanged in reference to different orientations of a display 99 or display tile 98 according to certain embodiments of the present invention.)

Each of the pixels 40 comprises one or more inorganic micro-light-emitting diodes 44, for example as shown in FIG. 1B, and, in certain embodiments, each of the one or more inorganic micro-light-emitting diodes 44 comprises a diode substrate independent, separate, and distinct from a display substrate 10. Thus, pixels 40 and inorganic micro-light-emitting diodes 44 can be independent structures that are individually mounted on a display substrate 10, for example by micro-transfer printing the independent structures onto the display substrate 10. For example, inorganic micro-light-emitting diodes 44 can be micro-transfer printed onto a pixel substrate 56 which is then micro-transfer printed onto a display substrate 10 or the printings can occur in the opposite order. Pixels 40 can include connections to power and ground lines 46, 48 that provide power to pixels 40 enabling the micro-iLEDs 44 to emit light.

Column lines 16 are disposed on a display substrate 10 and can extend toward a connection edge 32 and, for example, toward a bezel edge 30 opposing the connection edge 32. Each column line 16 is electrically connected to each pixel 40 in a column of pixels 40 to provide control signals to the pixels 40. One or more column lines 16 can be disposed between columns of pixels 40. In some embodiments, a single column line 16 is disposed between adjacent columns of pixels 40. In some embodiments, multiple column lines 16 are disposed between adjacent columns of pixels 40. Adjacent columns of pixels 40 are columns of pixels 40 that have no other column of pixels 40 between the adjacent columns. FIG. 1C illustrates a two-by-two array of pixels 40 and their connected row and column lines 12, 16. As shown in FIG. 1C, the row and column lines 12, 16 pass over or under each other over the display substrate 10 and are not directly electrically connected. In the figures, black dots indicate electrical connections between intersecting lines.

As shown in FIG. 1D, each pixel 40 is also interconnected with power and ground lines 46, 48. Row lines 12, column lines 16, power lines 46, and ground lines 48 can all be formed on a display substrate 10 using, for example, photolithographic, screen printing, or printed-circuit board processing techniques, for example employing metal or metal oxide deposition using evaporation or sputtering, laminated structures, curable resin coatings (e.g., SU8), positive or negative photo-resist coating, radiation (e.g., ultraviolet radiation) exposure through a patterned mask, or etching methods to form patterned metal structures, vias, insulating layers, and electrical interconnections. Inkjet and screen-printing deposition processes and materials can be used to form patterned conductors or other electrical elements, as can substrate imprinting techniques with conductive inks.

In some embodiments of the present invention, a bezel-free display 99 is a substantially single-layer display in which wires (e.g., row lines 12, column lines 16, power lines 46, and ground lines 48) are disposed substantially in a single layer in, on, or over a display substrate 10 and pixels 40 are also disposed in, on, or over the display substrate 10, for example in or on the same single layer. Where any of the row lines 12, column lines 16, power lines 46, or ground lines 48 intersect on, in, or over the display substrate 10, a jumper wire or via connection can be provided but these wires or connections represent only a small fraction of the area of the display substrate, so that the wires are substantially disposed in a single layer, for example a single patterned layer of metal lines that provide electrical connections to the pixels 40. By providing wires in a single layer on, in, or over a display substrate 10, manufacturing costs and materials for a bezel-free display 99 are substantially reduced.

Referring again to FIG. 1A, a column driver 26 is electrically connected to each column line 16 and is disposed on a display substrate 10. In some embodiments of the present invention, a column driver 26 for all of the column lines 16 can be a single integrated circuit, for example having a single column-driver substrate separate, distinct, and independent from a display substrate 10 and from diode substrates in pixels 40. In some embodiments of the present invention, a column driver 26 comprises a plurality of column-driver integrated circuits, each electrically connected to one or more column lines 16, and each having a column-driver substrate separate, distinct, and independent from a display substrate 10, from diode substrates in pixels 40, and from any other column-driver integrated circuit.

Figure 4:
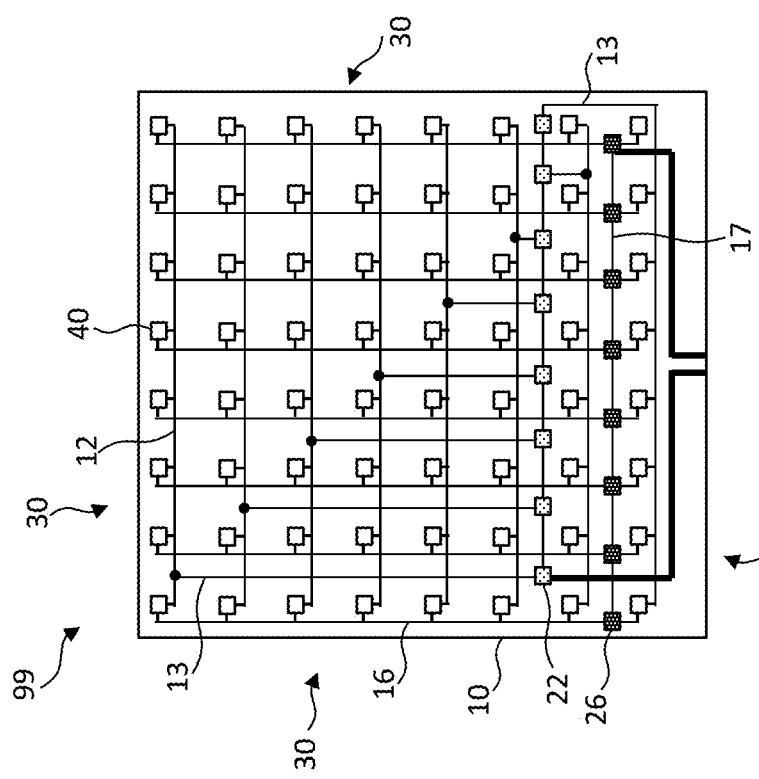

A plurality of column driver integrated circuits can be electrically serially connected and can be referred to collectively as a column driver 26. Alternatively, each column-driver integrated circuit with a separate, distinct, and independent column-driver substrate can be referred to as a column driver 26, as shown in the Figures. One or more column drivers 26 can be disposed between two or more pixels 40 in one or two dimensions, for example as shown in FIG. 4, as discussed further below. In some embodiments of the present invention, a column driver 26 comprises one or more active circuits formed in or on a display substrate 10, for example thin-film semiconductor circuits, such as amorphous silicon or low-temperature polycrystalline silicon circuits. One or more active circuits can be distributed over a display substrate 10, for example interconnected circuits disposed at different locations on the display substrate 10.

Similarly, row lines 12 are disposed on a display substrate 10 and can extend toward a bezel edge 30. Each row line 12 is electrically connected to each pixel 40 in a row of pixels 40. One or more row lines 12 can be disposed between rows of pixels 40. In some embodiments, a single row line 12 is disposed between adjacent rows of pixels 40.

In some embodiments, multiple row lines 12 are disposed between adjacent rows of pixels 40. Adjacent rows of pixels 40 are rows of pixels 40 that have no other row of pixels 40 between the adjacent rows.

A row driver 22 is electrically connected to each row line 12 and is disposed on a display substrate 10. In some embodiments of the present invention, a row driver 22 can be a single integrated circuit, for example having a row-driver substrate separate, distinct, and independent from a display substrate 10 and from diode substrates in pixels 40. In some embodiments of the present invention, a row driver 22 comprises a plurality of row-driver integrated circuits, each electrically connected to one or more row lines 12, and each having a row-driver substrate separate, distinct, and independent from a display substrate 10, from diode substrates in pixels 40, and from any other row-driver integrated circuit. A plurality of row driver integrated circuits can be electrically serially connected and can be referred to collectively as a row driver 22. Alternatively, each row-driver integrated circuit with a separate, distinct, and independent row-driver substrate can be referred to as a row driver 22, as shown in the Figures.

One or more row drivers 22 can be disposed between two or more pixels 40 in one or two dimensions, for example as shown in FIG. 1A. In some embodiments of the present invention, a row driver 22 comprises one or more active circuits formed in or on a display substrate 10, for example thin-film semiconductor circuits, such as amorphous silicon or low-temperature polycrystalline silicon circuits. One or more active circuits can be distributed over a display substrate 10, for example interconnected circuits disposed at different locations on the display substrate 10.

Figure 7:
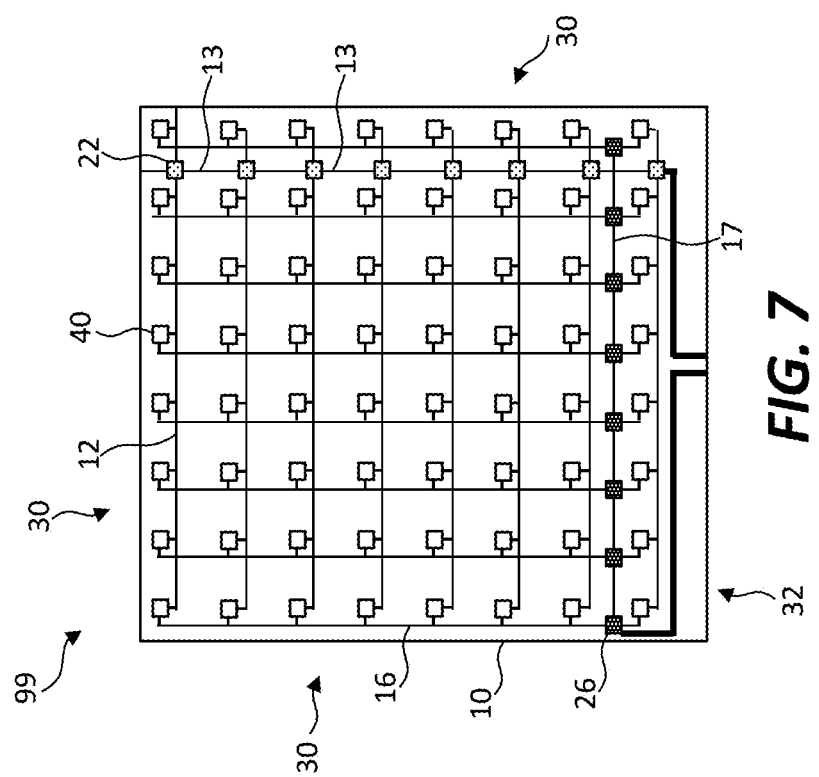

One or more row-connection lines 13 are disposed on the display substrate 10. Each row-connection line 13 is electrically connected to a row line 12 or to a row driver 22. At least one row-connection line 13 is disposed at least partially between columns of pixels 40. In some embodiments of the present invention, two or more row-connection lines 13 are disposed at least partially between columns of pixels 40. As shown in FIG. 1A, for example, each row-connection line 13 can extend from a display substrate 10 connection edge 32 to a row driver 22. In some embodiments, row drivers 22 are also electrically connected with row-connection lines 13 to row lines 12 (e.g., as labeled in FIG. 2 and as discussed further below). In some embodiments, row drivers 22 are electrically connected directly to row lines 12, without requiring an additional row-connection line 13 (e.g., as shown in FIG. 7 and as discussed further below).

Figure 2:
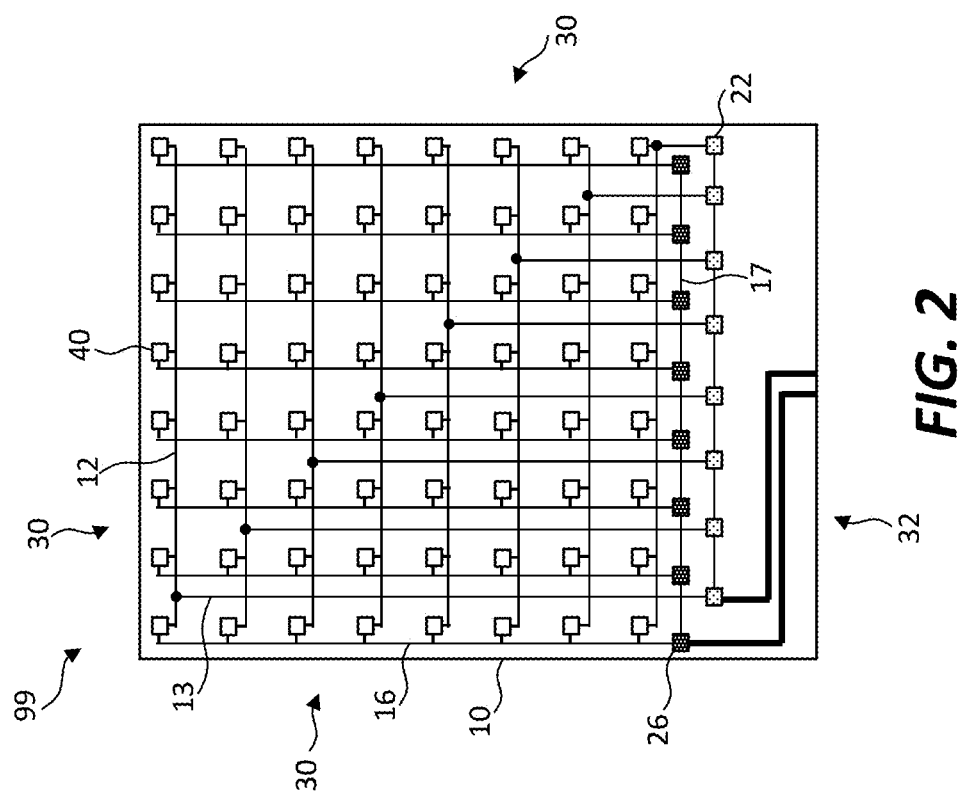

In some embodiments, two or more row-connection lines 13 are disposed at least partially between columns of pixels 40. Each row-connection line 13 can be uniquely disposed between columns of pixels 40 so that only one row-connection line 13 is disposed between two adjacent columns of pixels 40 (FIG. 2). Alternatively, multiple row-connection lines 13 can be disposed between columns of pixels 40 so that more than one row-connection line 13 is disposed between two adjacent columns of pixels 40.

According to some embodiments of the present invention, row drivers 22 and column drivers 26 are disposed in different locations over the display substrate 10. FIG. 1A illustrates row drivers 22 disposed within the display area and between pixels 40 and the column drivers 26 outside the display area and adjacent to the connection edge 32.

In some embodiments, each pixel 40 in a column of pixels 40 closest to a bezel edge 30 is spatially separated from the bezel edge 30 by a distance less than or equal to a column distance 18. In certain embodiments, a single column of pixels 40 is closest to a vertical bezel edge 30 and each pixel 40 in that single column is spatially separated from the bezel edge 30 by a distance less than or equal to a column distance 18 and the bezel has a width less than or equal to the column distance 18. Similarly, in some embodiments, each pixel 40 in a row of pixels 40 closest to a bezel edge 30 is spatially separated from the bezel edge 30 by a distance less than or equal to a row distance 14. In certain embodiments, a single row of pixels 40 is closest to a horizontal bezel edge 30 and each pixel 40 in that single row is spatially separated from the bezel edge 30 by a distance less than or equal to a row distance 14 and the bezel has a height less than or equal to the row distance 14.

In some embodiments, each pixel 40 in a column of pixels 40 closest to a bezel edge 30 is spatially separated from the bezel edge 30 by a distance less than or equal to one half of a column distance 18. For example, the bezel width can be one half or less of a column distance 18. Similarly, in some embodiments, each pixel 40 in a row of pixels 40 closest to a bezel edge 30 is spatially separated from the bezel edge 30 by a distance less than or equal to one half of a row distance 14. For example, the bezel height can be one half or less of a row distance 14. In some embodiments both are true, so that the bezel width can be one half or less of a column distance 18 and the bezel height can be one half or less of a row distance 14. In some such embodiments, the array of pixels can comprise a display tile that can be tiled without visible seams due to or between the pixels, since the pixel pitch in both vertical and horizontal directions is the same within a display tile and between adjacent display tiles.

In some embodiments, at least one row driver 22 is spatially separated from a corresponding row of pixels 40 to which it is electrically connected by a distance less than at least one of a column distance 18 and a row distance 14. At least one row driver 22 can be disposed on a display substrate 10 between columns of pixels 40. In some embodiments, at least one column driver 26 is spatially separated from a corresponding column of pixels 40 to which it is electrically connected by a distance less than at least one of a row distance 14 and a column distance 18. At least one column driver 26 can be disposed on a display substrate 10 between rows of pixels 40. In some embodiments both are true, so that at least one row driver 22 is spatially separated from a corresponding row of pixels 40 to which it is electrically connected by a distance less than at least one of a column distance 18 and a row distance 14 and at least one column driver 26 is spatially separated from a corresponding column of pixels 40 to which it is electrically connected by a distance less than at least one of a row distance 14 and a column distance 18. In some embodiments, column drivers 26 are separated from a corresponding column of pixels 40 to which it is electrically connected by a distance equal to or less than the column distance 18 and row drivers 22 are separated from a corresponding row of pixels 40 to which it is electrically connected by a distance to or less than the row distance 14.

In some embodiments of the present invention, referring to FIGS. 1A and 2, one of the row-connection lines 13 is disposed at least partially between one of the columns of the pixels 40 and one of the one or more bezel edges 30. Thus, a row-connection line 13 can be exterior to the display area of a bezel-free display 99.

Referring to FIG. 1A, each row driver 22 and column driver 26 is directly controlled through an electrical connection on the connection edge 32 by a display controller exterior to the display substrate 10 (not shown). In some embodiments, row drivers 22 and column drivers 26 are electrically serially connected, for example as shown in FIG. 2. A first one of the serially connected row drivers 22 and column drivers 26 is directly controlled through an electrical connection on the connection edge 32 by a display controller exterior to the display substrate 10 (not shown). This reduces the number of electrical connections on a connection edge 32 and the extent of row and column lines 12, 16 in the display area of a display substrate 10.

Row drivers 22 and column drivers 26 can be disposed in a variety of locations over a display substrate 10. Referring to FIG. 1A, row drivers 22 are disposed in a display area of a display substrate 10 between pixels 40. In some such embodiments, a row-connection line 13 extends from a connection edge 32 to each row driver 22 and from each row driver 22 to a corresponding row line 12 driven by the corresponding row driver 22. Column drivers 26 are disposed in a row adjacent to the connection edge 32.

Referring to FIG. 2, row drivers 22 and column drivers 26 are both disposed in a row adjacent to a connection edge 32. In some such embodiments, a row-connection line 13 extends from each row driver 22 to a corresponding row line 12 driven by the corresponding row driver 22. Both the row of row drivers 22 and the row of column drivers 26 are each serially electrically connected. The row of column drivers 26 is serially connected with a column-connection line 17.

Figure 3:
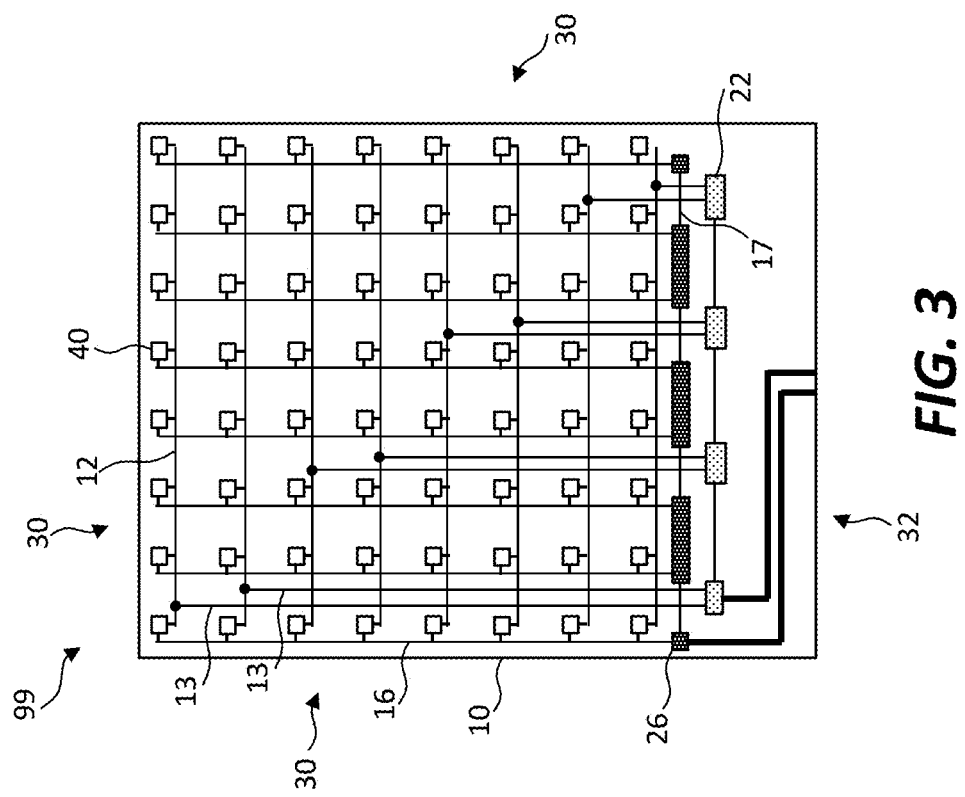
FIGS. 2-7 are schematic plan views illustrating different exemplary bezel-free displays according to illustrative embodiments of the present invention.

Referring to the illustrative embodiment shown in FIG. 3, each of one or more row drivers 22 is electrically connected to two row lines 12 with row-connection lines 13. This reduces the number of row drivers 22, although each row driver 22 can be larger and incorporate more circuitry. Moreover, in some embodiments, one or more column drivers 26 are electrically connected to two column lines 16 (as also shown in FIG. 3).

Referring to the illustrative embodiment shown in FIG. 4, row drivers 22 and column drivers 26 are both disposed in a display area between pixels 40 on a display substrate 10. As is also shown in FIGS. 2 and 3, row-connection lines 13 can extend from row drivers 22 to respective row lines 12.

Figure 5:
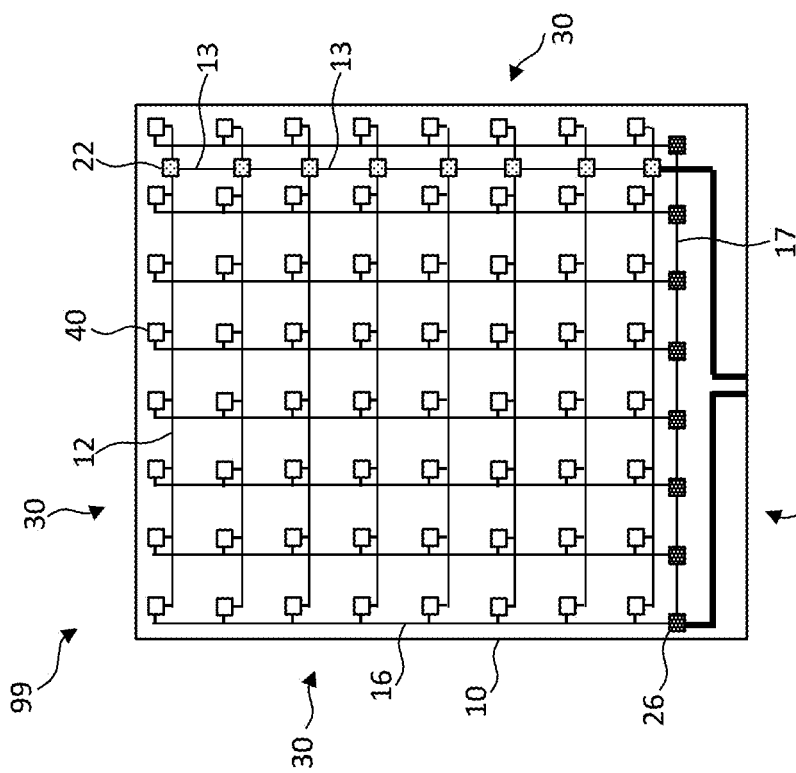

Referring to the illustrative embodiment shown in FIG. 5, each row driver 22 is the display area directly drives a corresponding row line 12 without an intervening row-connection line 13. The row drivers 22 are disposed in a column and are serially connected with row-connection lines 13. A first row driver 22 in the serial chain of row drivers 22 is connected through a wire on the connection edge to an external display driver (not shown).

Figure 6:
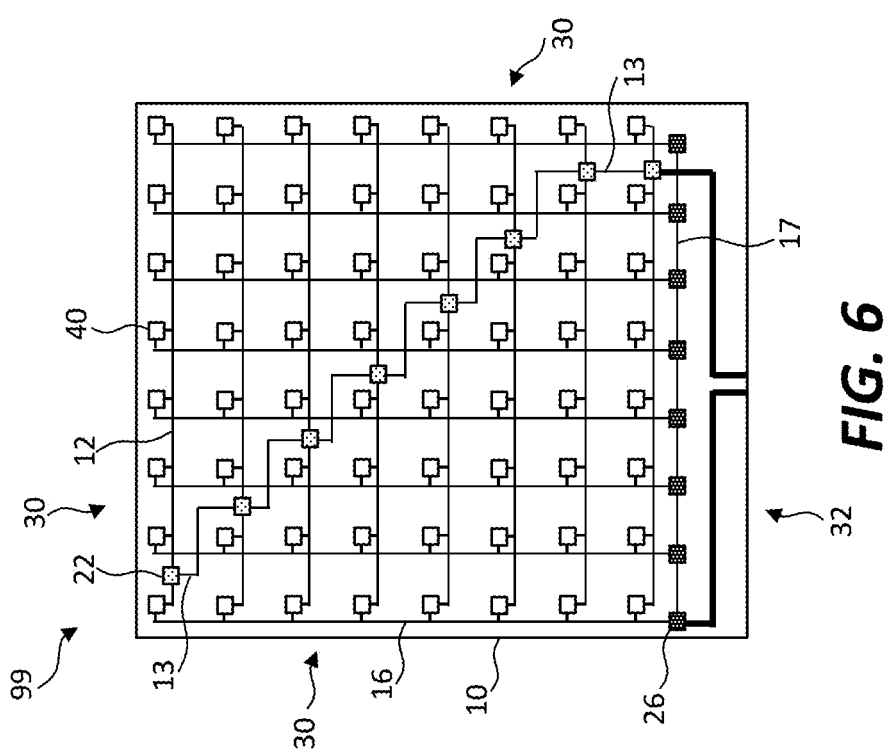

Referring to the illustrative embodiment shown in FIG. 6, row drivers 22 are distributed both horizontally and vertically across the display area and are electrically serially connected with row-connection lines 13. The column drivers 26 in the embodiments illustrated in both FIG. 5 and FIG. 6 are disposed between the bottom row of pixels 40 and the connection edge 32 and the connection edge 32. In the embodiment illustrated in FIG. 7, the vertically arranged serially electrically connected row drivers 22 and horizontally arranged serially electrically connected column drivers 26 are disposed within the display area between the pixels 40 of the bezel-free display 99.

In some embodiments of the present invention, a display substrate 10 can be any suitable substrate comprising a surface on which micro-iLEDs 44, row lines 12, column lines 16, row-connection lines 13, row drivers 22, or column drivers 26 can be disposed. Such display substrates 10 can be or comprise, for example, glass, plastic, or ceramic.

As shown in FIG. 1B, pixels 40 can include pixel controllers 42 and one or more micro-iLEDs 44, for example three micro-iLEDs 44 each emitting a different color of light, for example red, green, and blue, in response to control signals from a pixel controller 42, providing an active-matrix pixel 40. Thus, in some embodiments of the present invention, a bezel-free display 99 is an active-matrix display and each pixel 40 comprises a pixel controller 42 uniquely electrically connected to each pair of row lines 12 and column lines 16 for controlling inorganic micro-light-emitting diodes 44 in a pixel 40.

In some embodiments, pixels 40 do not include pixel controllers 42 and comprise one or more micro-iLEDs 44, for example three or more micro-iLEDs 44 each emitting a different color of light, for example red, green, and blue, in response to control signals from an external display controller, for example row or column controllers, providing a passive-matrix pixel 40 and passive-matrix bezel-free display 99.

In some embodiments of an active-matrix display, a pixel controller 42 is a micro-integrated circuit, for example comprising a controller substrate separate, distinct, and independent of any diode substrates and a display substrate 10, made using photolithographic methods and materials found in the integrated circuit industry. Column lines 16 and row lines 12 (and power lines 46 and ground lines 48) are electrically conductive wires, e.g., traces, for conducting electrical power and signals to pixels 40 and can be made, for example, using photolithographic, screen printing, or printed-circuit board materials and methods on or in the display substrate 10.

Inorganic micro-light-emitting diodes 44 can comprise a semiconductor diode substrate, for example a compound semiconductor such as GaN, InGaN, GaAs, or other compound semiconductors useful for light-emitting diodes made using photolithographic processes and materials.

In some embodiments of the present invention, each inorganic micro-light-emitting diode 44, each row driver 22, or each column driver 26 has at least one (e.g., any combination) of (i) a width from 2 to no more than 100 µm (e.g., 2 to no more than 5 µm, 5 to no more than 10 µm, 10 to no more than 20 µm, 20 to no more than 50 µm, or 50 to no more than 100 µm), (ii) a length from 2 to no more than 250

μm (e.g., 2 to no more than 5 μm, 5 to no more than 10 μm, 10 to no more than 20 μm, 20 to no more than 50 μm, 50 to no more than 100 μm, or 100 to no more than 250 μm), and (iii) a thickness from 2 to no more than 50 μm (e.g., 2 to no more than 5 μm, 5 to no more than 10 μm, 10 to no more than 20 μm, or 20 to no more than 50 μm). U.S. Pat. No. 6,825,559 describes methods of making micro-transfer-printable inorganic micro-iLEDs 44, the disclosure of which is hereby incorporated by reference.

Any combination of the inorganic micro-light-emitting diodes 44, row drivers 22, or column drivers 26 can be micro-devices micro-transfer printed from a native source wafer to the display substrate 10, another substrate, or to a substrate disposed on the display substrate 10. Any of the inorganic micro-light-emitting diodes 44, row drivers 22, or column drivers 26 can comprise a broken, fractured, or separated tether as a consequence of the micro-transfer printing process.

In some active-matrix embodiments of the present invention, micro-iLEDs 44 or pixel controllers 42 (if included in an active-matrix embodiment) are disposed directly on a display substrate 10. In some embodiments, referring to FIG. 8, each pixel 40 comprises a pixel substrate 56 with one or more inorganic micro-light-emitting diodes 44 disposed on the pixel substrate 56. A pixel controller 42 can be disposed on the pixel substrate 56, and the pixel substrate 56 disposed on the display substrate 10. (In passive-matrix embodiments of the present invention, the pixel controller 42 is not present.) Moreover, in some embodiments of the present invention, micro-iLEDs 44 (e.g., red micro-iLED 44R emitting red light, green micro-iLED 44G emitting green light, and blue micro-iLED 44B emitting blue light, collectively micro-iLEDs 44) can be micro-transfer printed onto a pixel substrate 56, for example from one or more native LED source wafers, and each micro-iLED 44 can comprise a broken (e.g., fractured) or separated micro-iLED tether 62 (as a consequence of micro-transfer printing). In some embodiments, a pixel controller 42 can be micro-transfer printed onto a pixel substrate 56, for example from a native silicon source wafer, and the pixel controller 42 can comprise a broken (e.g., fractured) or separated micro-controller tether 54. A pixel substrate 56 can be any useful substrate on which micro-iLEDs 44 or pixel controllers 42 (if included) can be disposed, for example that is or comprises glass, plastic, or ceramic. In some embodiments, a pixel substrate 56 is a semiconductor substrate and a pixel controller 42 is provided in a circuit formed in or on the pixel substrate 56, so that the pixel controller 42 is native to the pixel substrate 56 and can be electrically connected with fine, high-resolution pixel-substrate wires 58. Furthermore, in some embodiments of the present invention, a pixel substrate 56 is micro-transfer printed from a pixel source wafer 100 (shown in FIG. 9 and as discussed below) onto a display substrate 10 and a pixel substrate 56 comprises a broken (e.g., fractured) or separated pixel tether 52. A pixel substrate 56 can have at least one of (i) an area of 10 to no more than 1 square mm (e.g., 10 to no more than 50 square microns, 50 to no more than 100 square microns, 100 to no more than 500 square microns, or 500 square microns to no more than 1 square mm) and (ii) a thickness of 1 to no more than 50 microns (e.g., 1 to no more than 5 microns, 5 to no more than 10 microns, 10 to no more than 20 microns, or 20 to no more than 50 microns). Such small pixel substrates 56 can be more readily micro-transfer printed and constructed using high-resolution photolithographic techniques. Thus, pixel-substrate wires 58 or other electrical conductors disposed on the pixel substrates 56 can be formed using, for example, photolithographic methods and materials and have a small width, can be disposed closer together, and can have a higher resolution than wires or other electrical conductors such as row lines 12 and column lines 16 formed on a display substrate 10, for example by large-format photolithography, screen printing, or printed-circuit board construction and assembly techniques. Thus, pixel-substrate wires 58 on a pixel substrate 56 can be relatively fine, high-resolution wires and wires on a display substrate 10 (e.g., row lines 12, column lines 16, power lines 46, and ground lines 48) can be relatively coarse, low-resolution wires compared to the wires 58 on the pixel substrate 56. Therefore, in some embodiments of the present invention, high-resolution pixel substrates 56 are individually mounted on a display substrate 10 and micro-iLEDs 44 and pixel controller 42 (for active-matrix designs) are micro-devices individually mounted on each high-resolution pixel substrate 56.

Row lines 12, column lines 16, and pixel-substrate wires 58 can each, separately, comprise metal or metal alloys or transparent metal oxides (for example deposited on the display substrate 10 or pixel substrate 56 by evaporation or sputtering and patterned using photolithographic methods). Row lines 12, column lines 16, power lines 46, ground lines 48, and pixel-substrate wires 58 can each, separately, be disposed on or in a single layer or on or in multiple (e.g., different) substrate layers of a display substrate 10 or pixel substrate 56 so that they do not electrically short on a surface of a display substrate 10 or pixel substrate 56. Vias can be provided to make electrical connections between devices or structures disposed on a display substrate 10 or pixel substrate 56 surface and row lines 12, column lines 16, power lines 46, ground lines 48, or pixel-substrate wires 58 in a display- or pixel-substrate layer below a display substrate 10 or a pixel substrate 56 surface.

Figure 8:
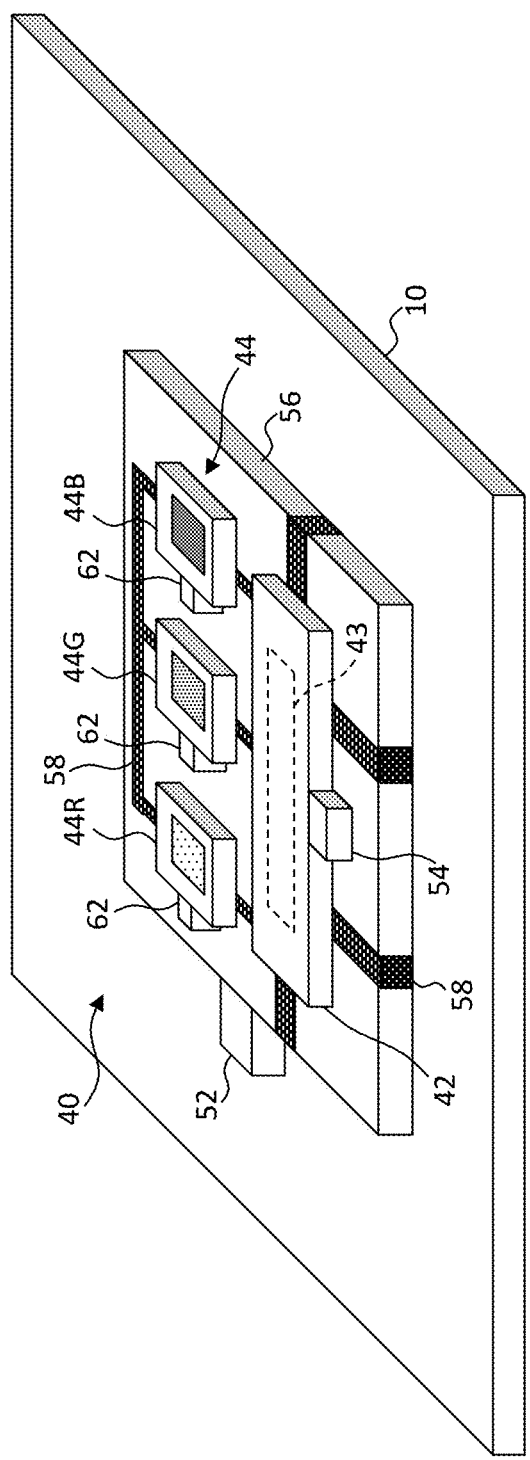
FIG. 8 is a perspective of an exemplary bezel-free display pixel according to illustrative embodiments of the present invention.
Figure 9:
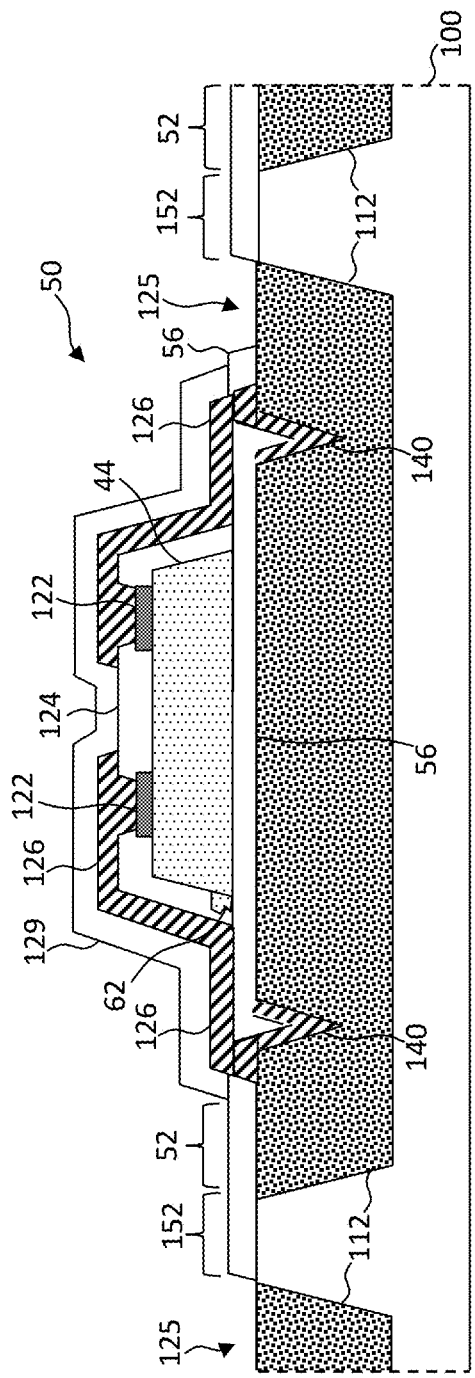
FIG. 9 is a cross section illustrating a micro-transfer printable pixel on a pixel source wafer according to exemplary embodiments of the present invention.

Certain embodiments of the present invention can be constructed by micro-transfer printing devices, such as micro-controllers 42 and inorganic micro-light-emitting diodes 44, from respective source wafers to a display substrate 10 or pixel substrate 56. Referring to FIGS. 8 and 9, in some embodiments of the present invention, two or more micro-iLEDs 44 are disposed on a pixel substrate 56, for example by micro-transfer printing inorganic micro-light-emitting diodes 44 from respective source wafers to a pixel substrate 56 on a pixel source wafer 100 (in the cross section of FIG. 9 one micro-iLED 44 is visible of a plurality of micro-iLEDs 44), and then micro-transfer printing the pixel substrates 56 from the pixel source wafer 100 to a display area of a display substrate 10. Micro-controllers 42 can also be micro-transfer printed from a native source substrate (such as a CMOS or mixed-signal native semiconductor wafer) to a pixel substrate 56. Components on a pixel substrate 56 can be electrically connected with relatively fine, high-resolution pixel-substrate wires 58 on the pixel substrate 56 that are electrically connected to relatively coarse, low-resolution row or column lines 12, 16 on a display substrate 10 to control a pixel controller 42 and micro-iLEDs 44 with signals, such as control, power, or ground signals, from an external display controller (not shown in the Figures). A pixel substrate 56 can, for example, be similar to a display substrate 10 (e.g., made of glass or plastic) but in a much smaller size, for example having an area of 10-50 square microns, 50-100 square microns, 100-500 square microns, or 500 square microns-1 square mm and can be only a few microns thick, for example 1-5 microns, 5-10 microns, 10-20 microns, or 20-50 microns thick.

Pixel-substrate wires 58 can be fine interconnections, for example having a width of less than 50 µm, less than 20 µm, less than 10 µm, less than five µm, less than two µm, or less than one µm. Row and column lines 12, 16 can include one or more crude lithography interconnections having a width from 2 µm to 2 mm. In some embodiments, fine interconnections (pixel-substrate wires 58) are provided on pixel substrates 56 using relatively high-resolution photolithographic methods and materials and coarse interconnections (row and column lines 12, 16) are provided on a display substrate 10 using relatively low-resolution screen printing or printed-circuit board methods and materials.

Micro-transfer printing has the advantage of enabling use of a crystalline silicon substrate for a pixel controller 42 that provides smaller higher-performance integrated circuit components than can be made in a layer of amorphous or polysilicon semiconductor available on a pixel substrate 56 or a large substrate such as a display substrate 10. In some embodiments, a display substrate 10 can include material, for example glass or plastic, different from a material in a semiconductor substrate (e.g., a pixel controller substrate), for example a semiconductor material such as silicon or a compound semiconductor. Such arrangements also have an advantage in that pixels 40 can be separately tested before they are located on the surface of a display substrate 10, thus improving yields and reducing costs.

In some embodiments of the present invention, components (e.g., pixels 40, micro-iLEDs 44, or pixel controllers 42) are constructed on and physically connected to a native source wafer with one or more tethers that hold the components in place with respect to the source wafer so that the components can be micro-transfer printed from the native source wafer, for example by contacting the components with respective posts of a transfer stamp to adhere the components to the stamp posts and then removing the transfer stamp from the source wafer, thereby breaking (e.g., fracturing) or separating the tethers. The components are then contacted to and adhered to a destination substrate, such as a display substrate 10 or pixel substrate 56 and the transfer stamp removed. FIG. 8 illustrates broken (e.g., fractured) micro-iLED tethers 62 resulting from micro-transfer printing red, green, and blue micro-iLEDs 44R, 44G, 44B from respective LED source wafers each comprising different materials, for example GaN and GaAs, that are suitable for making LEDs that emit light of different colors. FIG. 8 also illustrates broken (e.g., fractured) micro-controller tethers 54 resulting from micro-transfer printing micro-controllers 42 from a micro-controller source wafer, for example a CMOS integrated circuit. Referring to FIG. 9, the pixel 40 itself (in this case an active-matrix three-color pixel 40 as shown in the perspective of FIG. 8) is formed on a pixel substrate 56 on a pixel source wafer 100 and can be micro-transfer printed from the pixel source wafer 100 to a destination substrate, such as a display substrate 10, thereby breaking (e.g., fracturing) or separating pixel tethers 52 attached to the pixel substrate 56. In some embodiments, micro-iLEDs 44 and micro-controllers 42 (and respective fine interconnections) are disposed directly on a display substrate 10 (e.g., no pixel substrates 56 are present).

Referring to FIG. 9, one or more pixels 40, for example an array of pixels 40 are provided on a pixel source substrate 100 having a plurality of sacrificial portions 112 separated by anchors 152, for example transversely or laterally separated. Each pixel 40 is disposed entirely over a corresponding sacrificial portion 112 and can include, for example one or more electrically connected components such as micro-iLEDs 44 (e.g., micro-iLEDs 44R, 44G, 44B) and a micro-controller 42, with broken micro-iLED and micro-controller tethers 62, 54, as illustrated in FIGS. 8 and 9. The components can be protected with patterned dielectric material 124 and electronically connected with component contact pads 122 and patterned electrodes 126 connected to connection posts 140. Dielectric material forming an encapsulation layer 129 protects the components and can form a pixel tether 52 physically connecting the pixel 40 to an anchor 152. A sacrificial portion 112 can be etched through an opening 125 to release a pixel 40 from a pixel source substrate 100, except for the pixel tether 52. The pixel 40 can then be micro-transfer printed by pressing a stamp post against the pixel 40 to adhere the pixel 40 to the stamp post and removing the transfer stamp to fracture the pixel tether 52. The transfer stamp is moved to a display substrate 10 and the pixel 40 adhered to the display substrate 10, for example by pressing the connection posts 140 into an electrical contact on the display substrate 10.

In some embodiments of the present invention, pixels 40 can emit light in a direction opposite to or away from a display substrate 10 so that most or all of the emitted light does not pass or is not transmitted through the display substrate 10 (in a top-emitter configuration). In some embodiments of the present invention, pixels 40 can emit light in a direction towards a display substrate 10 so that most or all of the emitted light passes through the display substrate 10 (in a bottom-emitter configuration).

As shown in FIG. 8, pixels 40 can each comprise one or more inorganic micro-iLEDs 44. The micro-iLEDs 44 in a pixel 40 can include micro-iLEDs 44 that emit different colors of light, for example red light from red inorganic micro-light-emitting diode 44R, green light from green inorganic micro-light-emitting diode 44G, and blue light from blue inorganic micro-light-emitting diode 44B (collectively micro-iLEDs 44). In certain embodiments of the present invention, a bezel-free display 99 is a matrix-addressed bezel-free display 99 having row-select and column-data lines, e.g., row lines 12 (row-select wires) and column lines 16 (column-data wires). Each pixel 40 is controlled by a row-select line in combination with a column-data line. In some embodiments, a bezel-free display 99 is a passive-matrix display. In some embodiments, a bezel-free display 99 is an active-matrix display having a pixel controller 42 with a control circuit 43 provided for each pixel 40 (e.g., as shown in FIG. 8). A pixel controller 42 is disposed in, on, or over a display substrate 10 in association with one or more micro-iLEDs 44 in the pixel 40 and is electrically connected with wires to the one or more micro-iLEDs 44 to control the one or more micro-iLEDs 44 using signals provided on the row and column lines 12, 16.

In some embodiments, row and column lines 12, 16 (and power and ground lines 46, 48) are provided in substantially one metal layer on, in, or over the display substrate 10 with jumpers or connection vias to avoid electrical short circuits where the lines intersect and can be electrically connected to display substrate contact pads or other electrical connections suitable for connecting to display control circuits (not shown in the Figures). In some embodiments, row and column lines 12, 16 are provided in two or more metal layers on or in the display substrate 10 to avoid electrical short circuits and can be electrically connected to display substrate contact pads or other electrical connections suitable for connecting to display control circuits (not shown in the Figures).

Figure 10A:
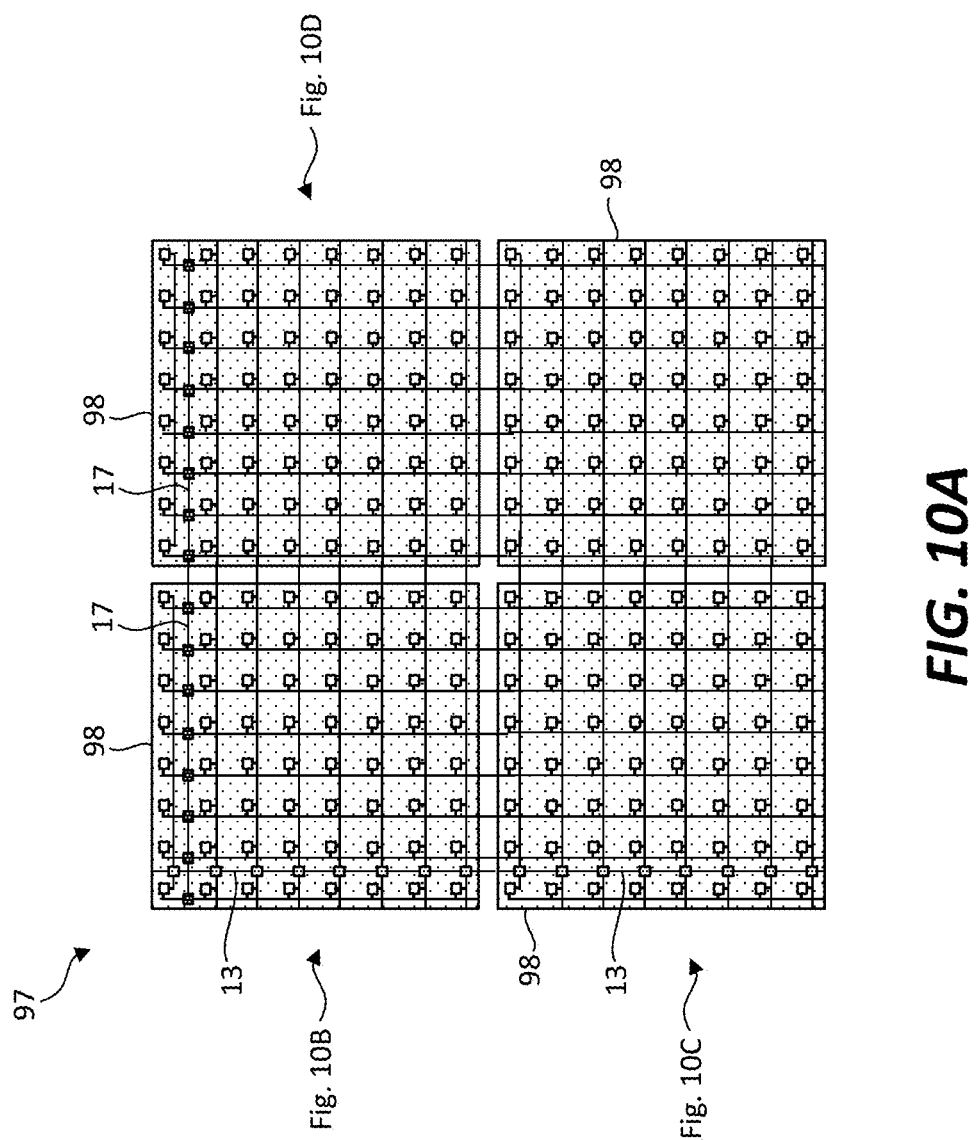
FIG. 10A is a plan view of a bezel-free tiled display according to illustrative embodiments of the present invention.
Figure 10D:
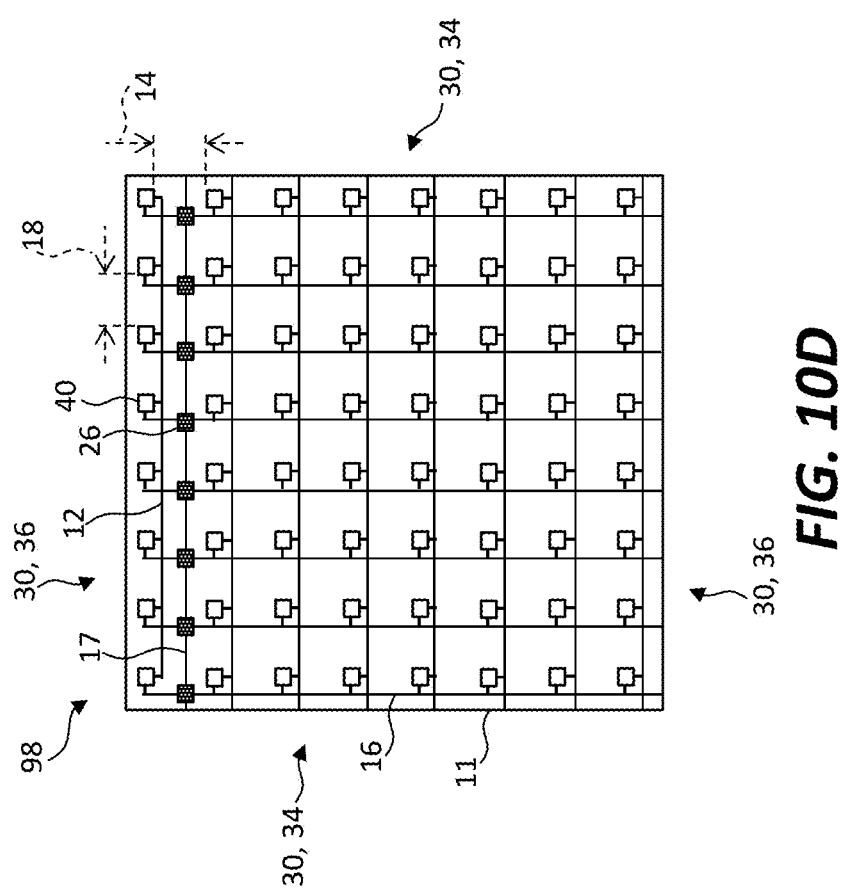
FIG. 10D is a plan view of a bezel-free tile in the tiled display of FIG. 10A comprising column drivers according to illustrative embodiments of the present invention.

FIG. 10A illustrates a bezel-free tiled display 97 comprising bezel-free display tiles 98 according to some embodiments of the present invention. The bezel-free display tiles 98 are arranged so that a display controller (not shown in FIG. 10A) is connected to the upper left bezel-free display tile 98 row-connection line 13 and column-connection line 17 (shown in more detail in FIG. 10B). This display controller connection arrangement is arbitrary; other functionally similar arrangements are also contemplated. In some embodiments of the present invention, the bezel-free display tile 98 connected to a display controller is in other locations either on any of the edges or in a central portion of a bezel-free tiled display 97 (for example, in the case of a 3×3 or larger bezel-free display tile 98 arrangement). Similarly, the lower left bezel-free display tile 98 (shown in more detail in FIG. 10C) can be in any column of bezel-free display tiles 98 in a bezel-free tiled display 97 corresponding to the disposition of the bezel-free display tile 98 of FIG. 10A. In the same way, upper right bezel-free display tile 98 (shown in more detail in FIG. 10D) can be in any column of bezel-free display tiles 98 in a bezel-free tiled display 97 corresponding to the disposition of the bezel-free display tile 98 of FIG. 10A. In any of these arrangements, it is only necessary that the row-connection lines 13 extend from one bezel-free display tile 98 to a neighboring, adjacent bezel-free display tile 98 in the same column of bezel-free display tiles 98 and that the column-connection lines 17 extend from one bezel-free display tile 98 to a neighboring adjacent bezel-free display tile 98 in the same row of bezel-free display tiles 98. Row lines 12 and column lines 16 must similarly be connected between bezel-free display tiles 98, for example using jumper wires, through-hole vias with back connections, or other tile electrical interconnection techniques.

As shown in FIGS. 10A-10D, according to some embodiments of the present invention, a bezel-free display tile 98 comprises a tile substrate 11 comprising at least four bezel edges 30. Two bezel edges 30 of the at least four bezel edges 30 are opposing row edges 36 and two of the bezel edges 30 of the at least four bezel edges 30 are opposing column edges 34 of the bezel-free display tile 98. Pixels 40 are individually disposed on the tile substrate 11 in rows and columns such that columns of pixels 40 are separated by a column distance 18, rows of pixels 40 are separated by a row distance 14, and each pixel 40 comprises one or more inorganic micro-light-emitting diodes 44 (shown in FIGS. 1B and 9). The row distance 14 can be, but is not necessarily, the same distance as the column distance 18. Each inorganic micro-light-emitting diode 44 comprises a diode substrate independent, separate, and distinct from a tile substrate 11.

Column lines 16 are disposed on a tile substrate 11 and extend toward at least one row edge 36. Each column line 16 is electrically connected to each pixel 40 in one of the columns of pixels 40. Similarly, row lines 12 are disposed on a tile substrate 11 and extend toward at least one column edge 34. Each row line 12 is electrically connected to each pixel 40 in one of the rows of pixels 40. In some embodiments, a column edge 34 is substantially parallel to a column of pixels 40 in a vertical direction and a row edge 36 is substantially parallel to a row of pixels 40 in a horizontal direction. As will be appreciated by those skilled in the art, "row" and "column" designations and "horizontal" and "vertical" designations are arbitrary and can be interchanged.

In some embodiments of the present invention, a row driver 22 is electrically connected to at least one row line 12 and a row driver 22 is disposed on a tile substrate 11 within at least one of a column distance 18 and a row distance 14 of the row line 12. Similarly, in some embodiments, a column driver 26 is electrically connected to at least one column line 16 and a column driver 26 is disposed on a tile substrate 11 within at least one of a row distance 14 and a column distance 18 of the column line 16. In some embodiments, both a row driver 22 and a column driver 26 are disposed as described.

In some embodiments, each pixel 40 in the column of pixels 40 closest to a column edge 34 is spatially separated from the column edge 34 by a distance less than or equal to a column distance 18. In some embodiments, each pixel 40 in the row of pixels 40 closest to a row edge 36 is spatially separated from the row edge 36 by a distance less than or equal to a row distance 14.

In some embodiments of the present invention, a row driver 22 is disposed within at least one of a column distance 18 and a row distance 14 of a corresponding row line 12 to which the row driver 22 is electrically connected and a column driver 26 is disposed within at least one of a row distance 14 and a column distance 18 of a corresponding column line 16 to which the column driver 26 is electrically connected.

In some embodiments of the present invention, (i) one or more inorganic micro-light-emitting diodes 44 are micro-transfer printed inorganic micro-light-emitting diodes 44 each comprising a broken (e.g., fractured) or separated tether, (ii) a row driver 22 is a micro-transfer printed integrated circuit comprising a broken or separated tether, (iii) a column driver 26 is a micro-transfer printed integrated circuit comprising a broken (e.g., fractured) or separated tether, or (iv) any combination of (i), (ii), and (iii).

In some embodiments of the present invention, and referring also to FIG. 8, the bezel-free display tile 98 comprises one or more pixels 40 that each comprise a pixel substrate 56 with the one or more inorganic micro-light emitting diodes 44 disposed on the pixel substrate 56. In some embodiments, the pixel substrate 56 has been micro-transfer printed onto a tile substrate 11 and the pixel substrate 56 comprises a broken (e.g., fractured) or separated tether.

Structures, methods, and materials useful with respect to a bezel-free display 99, for example as shown in FIGS. 1A-1C and as described above, can be, in some embodiments, applied to bezel-free display tiles 98 and bezel-free tiled displays 97 and vice versa.

Certain embodiments of the present invention comprise LED light-emitters, for example micro-iLEDs 44, that enable a relatively small aperture ratio and a substantially bezel-free display 99, for example greater than or equal to 50%, 70%, 80%, 90%, or 95% transparent to visible light. In various embodiments, the combined area of the light-emitting area of the micro-iLEDs 44 or the micro-iLEDs 44 themselves is less than or equal to 25%, 10%, 5%, 2%, 1%, 0.5%, 0.1%, 0.05%, or 0.01% of the display area or the minimum contiguous convex hull display area including all of the micro-iLEDs 44 on a display substrate 10. For example, micro-iLEDs 44 have been constructed having a planar size of 8×15 μm and area of 120 μm$^2$. For example, a 4k×2k full color display can have 4096×2048×3 LEDs 22 (each having an area of 120 μm$^2$) equaling a total micro-iLED 44 area of 3020 mm$^2$. A bezel-free display 99 having a display substrate 10 one meter high by two meters long has an area of two square meters or 2,000,000 mm$^2$, so that only 3020/2,000,000=0.15% of the display substrate 10 area is covered with the micro-iLEDs 44. An exemplary 8k×4k display of the same size with same-sized micro-iLEDs 44 will still have less than 1% of the display substrate 10 area covered by micro-iLEDs 44. Larger display areas or smaller micro-iLEDs will result in smaller percentages. Thus, relatively small pixels 40 are well suited for use in displays according to certain embodiments of the present invention by providing a relatively large amount of free space in the display area of a display substrate 10 in which row and column drivers 22, 26 and row-connection lines 13 can be disposed between pixels 40.

Structures and elements in accordance with certain embodiments of the present invention can be made and assembled using micro-transfer printing methods and materials. In some embodiments, micro-iLEDs 44 are prepared on a native source wafer, for example a sapphire wafer with compound semiconductors such as GaN or GaAs thereon with each type of micro-iLED 44 prepared on a different source wafer and released for micro-transfer printing with one or more micro-iLED tethers 62 (shown in FIGS. 8 and 9) physically connecting the micro-iLEDs 44 to an anchor 152 portion of the source wafer. Any pixel controller 42 provided in a separate integrated circuit, for example comprising silicon CMOS circuits, can similarly be prepared on a source wafer such as a silicon wafer. In certain embodiments, micro-iLEDs 44 and any pixel controller 42 components are then contacted with a micro-transfer printing stamp to fracture or otherwise break the micro-iLED tethers 62 and micro-controller tethers 54 and adhere the components to the transfer stamp, the transfer stamp is transferred to a non-native destination substrate such as the display substrate 10, and the components are contacted and adhered to the destination substrate. A different micro-transfer printing step can be used with each different source wafer. When micro-transfer printing components directly from the source wafers to the destination substrate (e.g., display substrate 10), each micro-transfer printed component will have a separate, distinct, and independent substrate and form a broken (e.g., fractured) micro-iLED or micro-controller tether 62, 54 such as that shown in FIG. 8. If, as in some embodiments, components are first micro-transfer printed to non-native pixel substrates 56 (e.g., as in FIGS. 8 and 9), the pixel substrates 56 themselves can be micro-transfer printed to a non-native destination substrate such as a display substrate 10 using the same released structure with a pixel tether 52 and micro-transfer printing process.

According to various embodiments of the present invention, a bezel-free display 99, a bezel-free tiled display 97, or a bezel-free display tile 98 includes a variety of designs having a variety of resolutions, micro-iLED 44 sizes, and display substrate 10 or tile substrate 11 and display area sizes. For example, embodiments with display substrates 10 or tile substrates 11 ranging from about 1 cm by 1 cm to about 10 m by 10 m in size are contemplated. In some embodiments, inorganic micro-light-emitting diodes 44 can have a size of one square micron to 500 square microns (e.g., at least one of a height from 2 to no more than 5 µm, 5 to no more than 10 µm, 10 to no more than 20 µm, or 20 to no more than 50 µm, a length from 2 to no more than 5 µm, 5 to no more than 10 µm, 10 to no more than 20 µm, or 20 to no more than 50 µm, and a width from 2 to no more than 5 µm, 5 to 10 no more than µm, 10 to no more than 20 µm, or 20 to no more than 50 µm). In general, larger micro-iLEDs 44 are most useful, but are not limited to, larger display substrates 10 or tile substrates 11. The resolution of micro-iLEDs 44 over a display substrate 10 can also vary, for example from 50 of micro-iLEDs 44 per inch to hundreds of micro-iLEDs 44 per inch, or even thousands of micro-iLEDs 44 per inch. For example, a three-color display having one thousand 10 µm×10 µm of micro-iLEDs 44 per inch (on a 25-µm pitch) has an aperture ratio of less than 16 percent (including only the area of micro-iLEDs 44). Thus, certain embodiments of the present invention have application in both low-resolution and very high-resolution bezel-free displays 99.

According to certain embodiments of the present invention, a display substrate 10 can include layers formed on an underlying structure or substrate, for example a rigid or flexible glass or plastic substrate. In some embodiments, micro-iLEDs 44 are formed in a layer on a display substrate 10 or tile substrate 11 so that the micro-iLEDs 44 are native to the display substrate 10. In some embodiments, micro-iLEDs 44 are transferred from another substrate (such as a semiconductor source wafer) to a display substrate 10, tile substrate 11, or pixel substrate 56 so that the micro-iLEDs 44 are non-native to the display substrate 10, tile substrate 11, or pixel substrate 56.

In some embodiments of the present invention, micro-iLEDs 44 have light-emissive areas or a size of less than 10, 20, 50, or 100 square microns. Such micro-iLEDs 44 have the advantage of a small light-emissive area compared to their brightness as well as color purity providing highly saturated display colors and a substantially Lambertian emission providing a wide viewing angle for a bezel-free display 99 according to certain embodiments of the present invention. In various embodiments, a display area of a display substrate 10 is greater than or equal to eight times, ten times, twenty times, fifty times, one hundred times, two hundred times, five hundred times, one thousand, or ten thousand times the combined light-emissive areas of the micro-iLEDs 44 or the areas of the micro-iLEDs 44.

Certain embodiments of the present invention can be operated in a variety of useful ways. In some embodiments, a display controller (not shown in the Figures) provides power, a ground reference, and control signals to pixels 40 in a bezel-free display 99 through the power, ground, row, and column lines 46, 48, 12, 16. The control signals can provide a passive-matrix control of micro-iLEDs 44 in pixels 40 to provide functionality to a bezel-free display 99. In some embodiments, pixels 40 include a pixel controller 42. A display controller is connected to pixel controllers 42 through row and column lines 12, 16 and provides control signals for controlling micro-iLEDs 44, for example in an active-matrix control configuration. In some embodiments, a pixel controller 42 includes analog, digital, or mixed-signal circuitry and can control micro-iLEDs 44 in response to a display controller to emit light in an image-wise fashion in the display area, for example displaying images, graphics, text, or other information.

U.S. Pat. Nos. 8,722,458, 7,622,367 and 8,506,867 each discuss micro-transfer printing techniques, the disclosure from each of which is hereby incorporated by reference. In some embodiments, micro-iLEDs 44 are electrically connected to row and column lines 12, 16 on a display substrate 10 by a process of micro-transfer printing, using connection posts 140 formed with micro-iLEDs 44 (shown in FIG. 9), as described in U.S. Pat. No. 8,889,485. In certain embodiments, transferred micro-iLEDs 44, pixel controller 42, or pixel substrates 56 are interconnected to the row and column lines 12, 16 on the display substrate 10 using photolithographic or printed-circuit board materials and methods, to enable the display controller to electrically interact with the micro-iLEDs 44 to emit light in a bezel-free display 99.

In an exemplary process, transfer or construction of micro-iLEDs 44 is performed before or after all the row and column lines 12, 16 are in place. Thus, in some embodiments, construction of row and column lines 12, 16 can be performed before the micro-iLEDs 44 are printed or after the micro-iLEDs 44 are printed. In some embodiments, a display controller is externally located (for example on a separate printed-circuit board substrate) and electrically connected to the row and column lines 12, 16 using connectors, ribbon cables, or the like. In some embodiments, a display controller is affixed to a display substrate 10 outside a display area and electrically connected to row and column lines 12, 16 using wires and buses, for example using surface mount and soldering technology (not shown).

Methods of forming micro-transfer printable structures are described, for example, in the paper Inorganic light-emitting diode displays using micro-transfer printing (Journal of the Society for Information Display, 2017, DOI #10.1002/j sid.610, 1071-0922/17/2510-0610, pages 589-609) and U.S. Pat. No. 8,889,485, referenced above. Micro-transfer printing using compound micro-assembly structures and methods can also be used with certain embodiments of the present invention, for example, as described in U.S. patent application Ser. No. 14/822,868, filed Aug. 10, 2015, entitled Compound Micro Assembly Strategies and Devices, the disclosure of which is hereby incorporated by reference in its entirety. Additional details useful in understanding and performing certain embodiments of the present invention are described in U.S. patent application Ser. No. 14/743,981, filed Jun. 18, 2015, entitled Micro Assembled LED Displays and Lighting Elements, the disclosure of which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Furthermore, the designations of "row" or "column" with respect to matrix addressing are arbitrary and can be exchanged.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

10 display substrate
11 tile substrate
12 row line
13 row-connection line
14 row distance
16 column line
17 column-connection line
18 column distance
22 row driver
26 column driver
30 bezel edge
32 connection edge
34 column edge
36 row edge
40 pixel
42 micro-controller/pixel controller
43 control circuit
44 inorganic micro-light-emitting diode (LED)/micro-iLED
44R red-light-emitting diode
44G green-light-emitting diode
44B blue-light-emitting diode
46 power line
48 ground line
52 pixel tether
54 micro-controller tether
56 pixel substrate
58 pixel-substrate wire
62 micro-iLED tether
97 bezel-free tiled display
98 bezel-free display tile
99 bezel-free display
100 pixel source substrate/pixel source wafer
112 sacrificial portion
122 component contact pad
124 patterned dielectric material
125 opening
126 electrode
129 encapsulation layer
140 connection post
152 anchor

What is claimed:

1. A bezel-free display tile, comprising:
a tile substrate comprising at least four bezel edges, two bezel edges of the at least four bezel edges are opposing row edges and two bezel edges of the at least four bezel edges are opposing column edges;
pixels individually disposed on the tile substrate in rows and columns such that columns of the pixels are separated by a column distance, rows of the pixels are separated by a row distance, and each of the pixels comprises one or more inorganic micro-light-emitting diodes, each of the one or more inorganic micro-light-emitting diodes comprising a diode substrate independent, separate, and distinct from the tile substrate;
column lines disposed on the tile substrate and extending toward at least one of the two row edges, each column line electrically connected to each of the pixels in one of the columns of the pixels;
row lines disposed on the tile substrate and extending toward at least one of the two column edges, each row line electrically connected to each of the pixels in one of the rows of the pixels; and
at least one of:
(i) a row driver electrically connected to at least one of the row lines, the row driver disposed on the tile substrate entirely within at least one of the column distance and the row distance of the at least one of the row lines, and
(ii) a column driver electrically connected to at least one of the column lines, the column driver disposed on the tile substrate entirely within at least one of the row distance and the column distance of the at least one of the column lines,
wherein
(i) each pixel in one of the columns of the pixels closest to a column edge of the two opposing column edges is entirely spatially separated from the column edge by a distance less than or equal to the column distance, and
(ii) each pixel in one of the rows of the pixels closest to a row edge of the two opposing row edges is entirely spatially separated from the row edge by a distance less than or equal to the row distance.

2. The bezel-free display tile of claim 1, comprising a row driver disposed entirely within a column distance or a row distance of a corresponding row line to which the row driver is electrically connected and a column driver disposed entirely within a row distance or a column distance of a corresponding column line to which the column driver is electrically connected.

3. The bezel-free display tile of claim 1, wherein (i) the one or more inorganic light-emitting diodes are micro-transfer printed light-emitting diodes each comprising a broken or separated tether, (ii) the row driver is a micro-transfer printed integrated circuit comprising a broken or separated tether, (iii) the column driver is a micro-transfer printed integrated circuit comprising a broken or separated tether, or (iv) any combination of (i), (ii), and (iii).

4. The bezel-free display tile of claim 1, wherein one or more of the pixels each comprise a pixel substrate with the one or more inorganic light emitters disposed on the pixel substrate.

5. The bezel-free display tile of claim 4, wherein the pixel substrate has been micro-transfer printed onto the tile substrate, and the pixel substrate comprises a broken or separated tether.

6. The bezel-free display of claim 5, wherein the pixel substrate has at least one of (i) an area of 10 to no more than 50 square microns, 50 to no more than 100 square microns, 100 to no more than 500 square microns, or 500 square microns to no more than 1 square mm and (ii) a thickness of 1 to no more than 5 microns, 5 to no more than 10 microns, 10 to no more than 20 microns, or 20 to no more than 50 microns.

7. The bezel-free display of claim 1, wherein each row driver or each column driver has at least one of (i) a width from 2 to no more than 5 μm, 5 to no more than 10 μm, 10 to no more than 20 μm, 20 to no more than 50 μm, or 50 to no more than 100 μm, (ii) a length from 2 to no more than 5 μm, 5 to no more than 10 μm, 10 to no more than 20 μm, 20 to no more than 50 μm, 50 to no more than 100 μm, 100 to no more than 250 μm, and (iii) a thickness from 2 to no more than 5 μm, 5 to no more than 10 μm, 10 to no more than 20 μm, or 20 to no more than 50 μm.

8. The bezel-free display of claim 1, (i) comprising the row driver, wherein the row driver is a micro-transfer-printed micro-integrated circuit comprising a broken or separated tether, (ii) comprising the column driver, wherein the column driver is a micro-transfer-printed micro-integrated circuit comprising a broken or separated tether, or (iii) any combination of (i) and (ii).

9. The bezel-free display of claim 1, wherein two or more of the row lines are disposed at least partially between columns of the pixels.

10. The bezel-free display of claim 1, wherein one of the row lines is disposed at least partially between the column of the pixels closest to a bezel edge and the bezel edge.

11. The bezel-free display of claim 1, comprising the row driver, wherein each row driver comprises a row-driver substrate separate, distinct, and independent of the display substrate and the row-driver substrate of any other row driver, and each row driver is electrically connected to one or more of the row lines.

12. The bezel-free display of claim 1, comprising the row driver, wherein one or more of the row drivers is electrically connected to two of the row lines.

13. The bezel-free display of claim 1, comprising the column driver, wherein each column driver comprises a column-driver substrate separate, distinct, and independent of the display substrate and the column-driver substrate of any other column driver, and each column driver is electrically connected to one or more of the column lines.

14. The bezel-free display of claim 1, comprising the column driver, wherein one or more of the column drivers is electrically connected to two of the column lines.

15. The bezel-free display of claim 1, wherein at least one row driver (i) is disposed between two adjacent pixel columns, (ii) is disposed between two adjacent pixel rows, or (iii) both (i) and (ii).

16. The bezel-free display of claim 1, wherein at least one column driver (i) is disposed between two adjacent pixel columns, (ii) is disposed between two adjacent pixel rows, or (iii) both (i) and (ii).

17. The bezel-free display of claim 1, comprising the row driver and wherein the row driver is disposed between two or more of the pixels in one or two dimensions.

18. The bezel-free display of claim 1, comprising the column driver and wherein the column driver is disposed between two or more of the pixels in one or two dimensions.

* * * * *